US010050016B2

United States Patent
Lee et al.

(10) Patent No.: US 10,050,016 B2
(45) Date of Patent: Aug. 14, 2018

(54) FAN-OUT SEMICONDUCTOR PACKAGE

(71) Applicant: SAMSUNG ELECTRO-MECHANICS CO., LTD., Suwon-si, Gyeonggi-do (KR)

(72) Inventors: Sang Jin Lee, Suwon-si (KR); Min Seok Jang, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/627,957

(22) Filed: Jun. 20, 2017

(65) Prior Publication Data

US 2018/0096968 A1   Apr. 5, 2018

(30) Foreign Application Priority Data

Oct. 4, 2016   (KR) .................. 10-2016-0127824

(51) Int. Cl.
  *H01L 23/02* (2006.01)
  *H01L 25/065* (2006.01)
  *H01L 25/16* (2006.01)

(52) U.S. Cl.
  CPC .......... *H01L 25/0652* (2013.01); *H01L 25/16* (2013.01); *H01L 2225/06513* (2013.01); (Continued)

(58) Field of Classification Search
  CPC .............. H01L 21/486; H01L 23/5389; H01L 2224/04105; H01L 2924/181; H01L 2224/02379; H01L 23/5384
  (Continued)

(56) References Cited

U.S. PATENT DOCUMENTS 8,278,746 B2   10/2012   Ding et al.
2008/0136002 A1*   6/2008   Yang .................. H01L 24/82
                                          257/686
(Continued)

FOREIGN PATENT DOCUMENTS

CN     102214641 A    10/2011
CN     103168358 A     6/2013
(Continued)

OTHER PUBLICATIONS

Taiwanese Office Action issued in corresponding Taiwanese Patent Application No. 106120991, dated Jun. 12, 2018, with English Translation.

*Primary Examiner* — S. V. Clark
(74) *Attorney, Agent, or Firm* — McDermott Will & Emery LLP

(57) ABSTRACT

A fan-out semiconductor package includes: a first connection member having a through-hole; a first component disposed in the through-hole; a second component disposed in the through-hole and attached to the first component; an encapsulant filling at least portions of spaces between walls of the through-hole and side surfaces of the first component and side surfaces of the second component; a second connection member disposed on the first connection member and the first component; and a third connection member disposed on the first connection member and the second component. A number of at least one of the first or second components is plural, the second and third connection members are connected to each other through the first connection member, and the first connection member includes a redistribution layer electrically connected to a redistribution layer of the second connection member and a redistribution layer of the third connection member.

20 Claims, 27 Drawing Sheets

(52) U.S. Cl.
CPC ............... *H01L 2225/06517* (2013.01); *H01L 2225/06548* (2013.01)

(58) Field of Classification Search
USPC ........................................ 257/686, 777, 787
See application file for complete search history.

(56) References Cited

U.S. PATENT DOCUMENTS

| | | | |
|---|---|---|---|
| 2008/0197469 A1* | 8/2008 | Yang ................... | H01L 25/0652 257/686 |
| 2010/0283140 A1* | 11/2010 | Kim .................... | H01L 23/3128 257/686 |
| 2011/0241192 A1* | 10/2011 | Ding ................... | H01L 21/6835 257/686 |
| 2015/0228628 A1 | 8/2015 | Pagaila et al. | |
| 2016/0043047 A1 | 2/2016 | Shim et al. | |

FOREIGN PATENT DOCUMENTS

| | | |
|---|---|---|
| KR | 10-2015-0018946 A | 2/2015 |
| TW | 201618196 A | 5/2016 |
| WO | 2012/012338 A1 | 1/2012 |

* cited by examiner

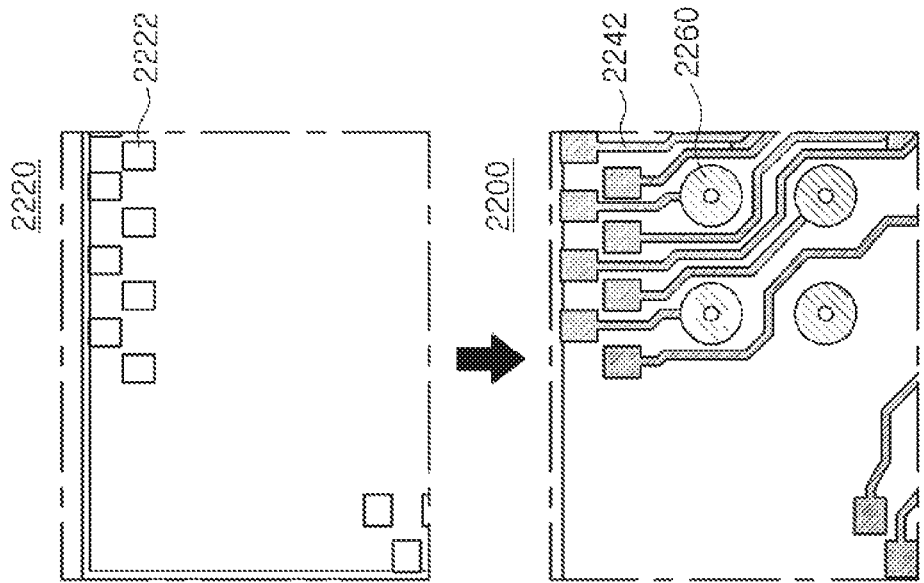
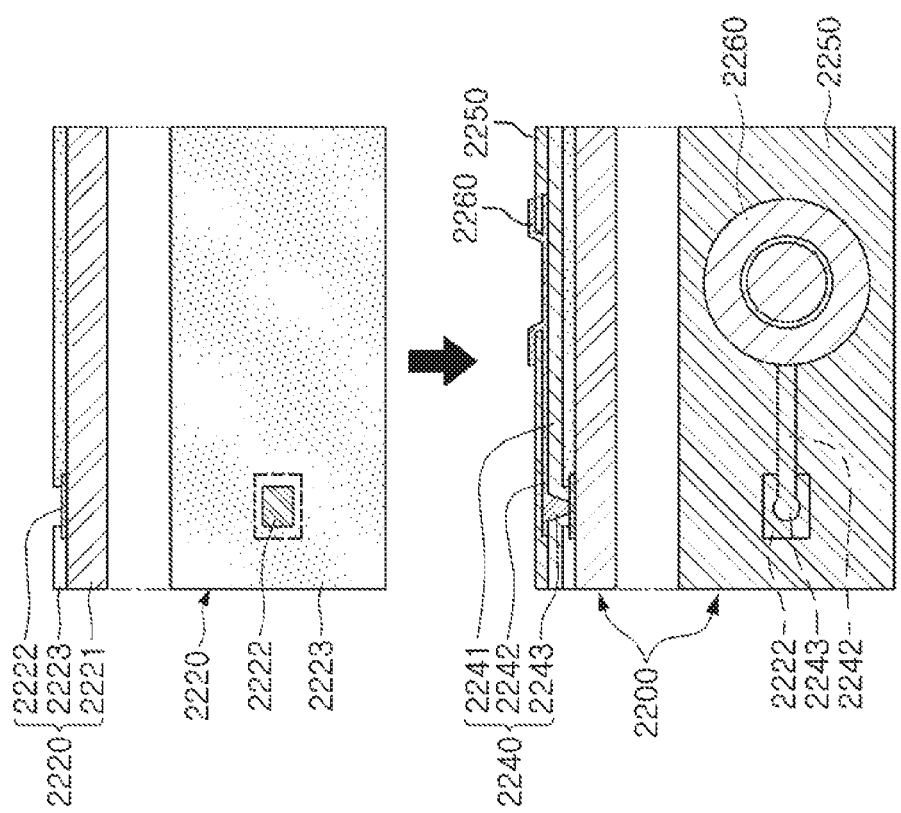
FIG. 3A
FIG. 3B

FAN-OUT SEMICONDUCTOR PACKAGE

CROSS-REFERENCE TO RELATED APPLICATION(S)

This application claims benefit of priority to Korean Patent Application No. 10-2016-0127824, filed on Oct. 4, 2016 in the Korean Intellectual Property Office, the disclosure of which is incorporated herein by reference in its entirety.

TECHNICAL FIELD

The present disclosure relates to a semiconductor package, and, more particularly, to a fan-out semiconductor package in which connection terminals may extend outwardly of a region in which a semiconductor chip is disposed.

BACKGROUND

Recently, a significant recent trend in the development of technology related to semiconductor chips has been to reduce the size of semiconductor chips. Therefore, in the field of package technology, in accordance with a rapid increase in demand for small-sized semiconductor chips, or the like, the implementation of a semiconductor package having a compact size while including a plurality of pins has been demanded.

One type of package technology suggested to satisfy the technical demand described above is a fan-out semiconductor package. Such a fan-out semiconductor package has a compact size and may allow a plurality of pins to be implemented by redistributing connection terminals outwardly of a region in which a semiconductor chip is disposed.

SUMMARY

An aspect of the present disclosure may provide a fan-out semiconductor package capable of simultaneously performing various functions and being miniaturized and thinned.

According to an aspect of the present disclosure, a fan-out semiconductor package may be provided, in which a first connection member having a through-hole is introduced, a plurality of components are disposed in a special form, such as a vertical form in a through-hole, and a second connection member and a third connection member are disposed on and beneath a component of the first connection member, respectively, and are electrically connected to each other.

According to an aspect of the present disclosure, a fan-out semiconductor package may include: a first connection member having a through-hole; a first component disposed in the through-hole; a second component disposed in the through-hole and attached to the first component; an encapsulant filling at least portions of spaces between walls of the through-hole and side surfaces of the first component and side surfaces of the second component; a second connection member disposed on the first connection member and the first component and including a redistribution layer electrically connected to the first component; and a third connection member disposed on the first connection member and the second component and including a redistribution layer electrically connected to the second component. A number of at least one of the first or second components is plural, the second and third connection members are connected to each other through the first connection member, and the first connection member includes a redistribution layer electrically connected to the redistribution layer of the second connection member and the redistribution layer of the third connection member.

BRIEF DESCRIPTION OF DRAWINGS

The above and other aspects, features, and advantages of the present disclosure will be more clearly understood from the following detailed description, taken in conjunction with the accompanying drawings, in which:

FIGS. 3A and 3B are schematic cross-sectional views illustrating states of a fan-in semiconductor package before and after being packaged;

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

The meaning of a "connection" of a component to another component in the description includes an indirect connection through an adhesive layer as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
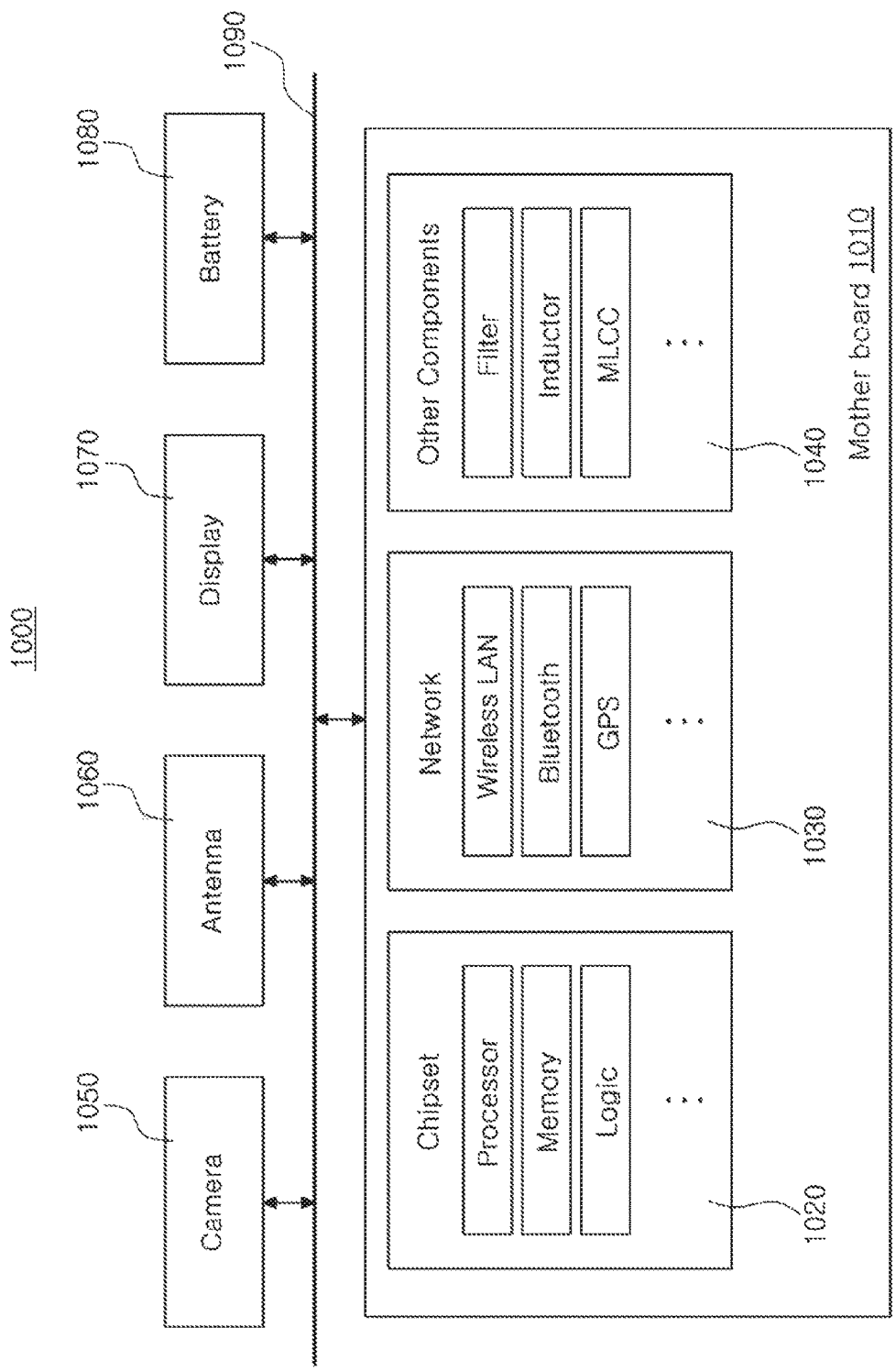
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mother board 1010 therein. The mother board 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip, such as a central processor (for example, a central processing unit (CPU)), a graphics processor (for example, a graphics processing unit (GPU)), a digital signal processor, a cryptographic processor, a microprocessor, a microcontroller, or the like; and a logic chip, such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated since the designation of the above-mentioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mother board 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes, depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
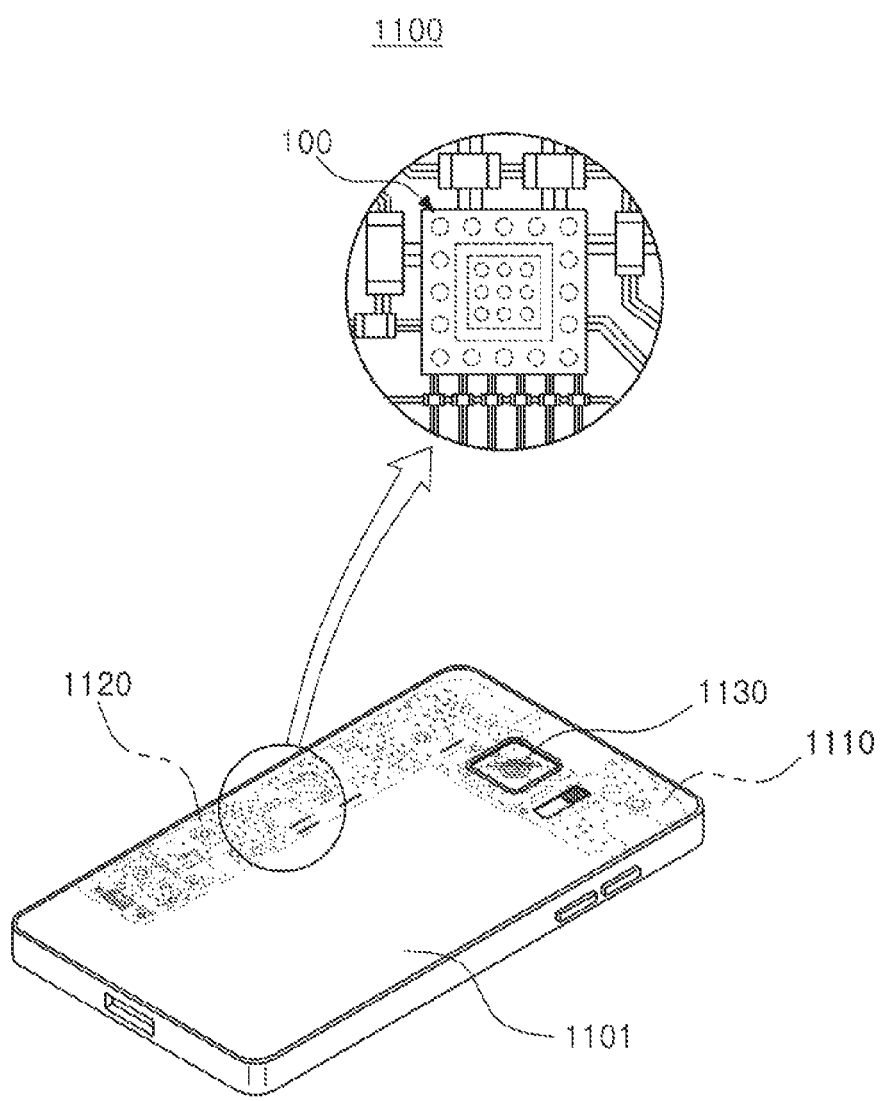
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 described above. For example, a main board 1110 may be accommodated in a body 1101 of a smartphone 1100, and various electronic components 1120 may be physically or electrically connected to the main board 1110. In addition, other components that may or may not be physically or electrically connected to the main board 1110, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a main board of the electronic device, in terms of electrical connections. Specifically, a size of connection pads of the semiconductor chip and an interval between the connection pads of the semiconductor chip may be very fine, but a size of component mounting pads of the main board used in the electronic device and an interval between the component mounting pads of the main board may be significantly larger than those of the semiconductor chip. Therefore, it may be difficult to directly mount the semiconductor chip on the main board, and packaging technology for buffering a difference in a circuit width between the semiconductor chip and the main board is required.

A semiconductor package manufactured by the packaging technology may be classified as a fan-in semiconductor package or a fan-out semiconductor package, depending on a structure and a purpose thereof.

The fan-in semiconductor package and the fan-out semiconductor package will hereinafter be described in more detail, with reference to the drawings.

(Fan-In Semiconductor Package)

FIGS. 3A and 3B are schematic cross-sectional views illustrating states of a fan-in semiconductor package before and after being packaged.

Figure 4:
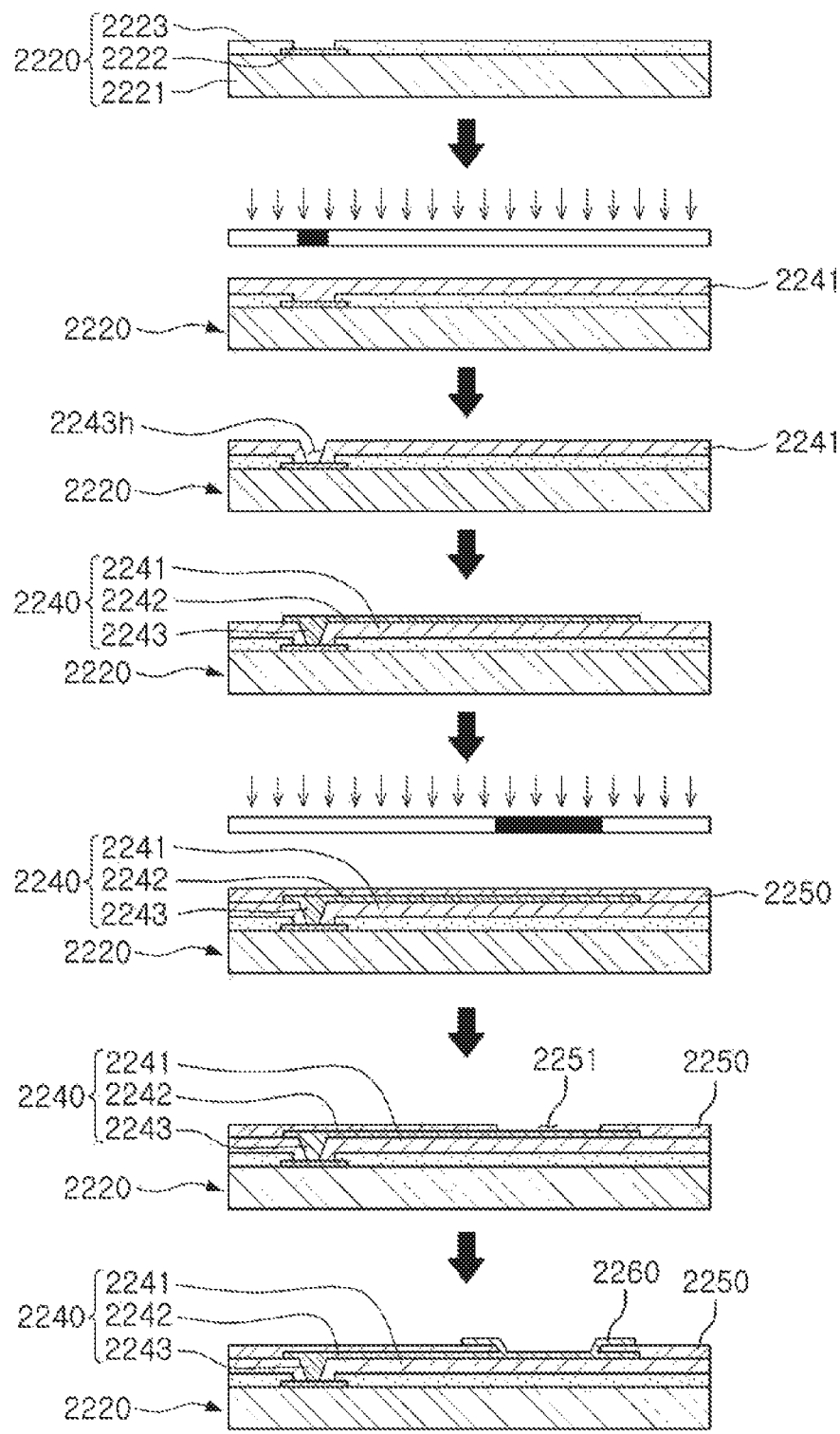
FIG. 4 is schematic cross-sectional views illustrating a packaging process of a fan-in semiconductor package.

FIG. 4 is a number of schematic cross-sectional views illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 may be very small, it may be difficult to mount the integrated circuit (IC) on an intermediate level printed circuit board (PCB), as well as on the main board of the electronic device, or the like.

Therefore, a connection member 2240 may be formed, depending on a size of the semiconductor chip 2220, on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243*h* opening the connection pads 2222, and then forming wiring patterns 2242 and vias 2243. Then, a passivation layer 2250, protecting the connection member 2240, may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260, may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. Specifically, many elements mounted in smartphones have been developed to implement a rapid signal transfer while having a compact size.

However, since all I/O terminals need to be disposed inside the semiconductor chip in the fan-in semiconductor package, the fan-in semiconductor package has a large spatial limitation. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the main board of the electronic device. The reason is that, even in a case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to mount the fan-in semiconductor package directly on the main board of the electronic device.

Figure 5:
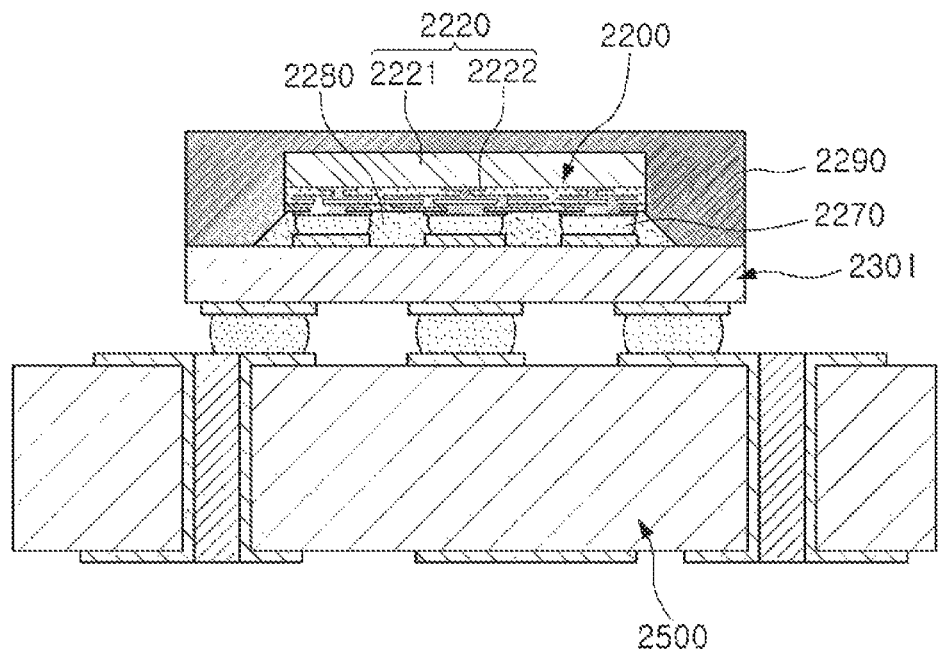
FIG. 5 is a schematic cross-sectional view illustrating a case in which a fan-in semiconductor package is mounted on an interposer substrate and is finally mounted on a main board of an electronic device.

FIG. 5 is a schematic cross-sectional view illustrating a case in which a fan-in semiconductor package is mounted on an interposer substrate and is finally mounted on a main board of an electronic device.

Figure 6:
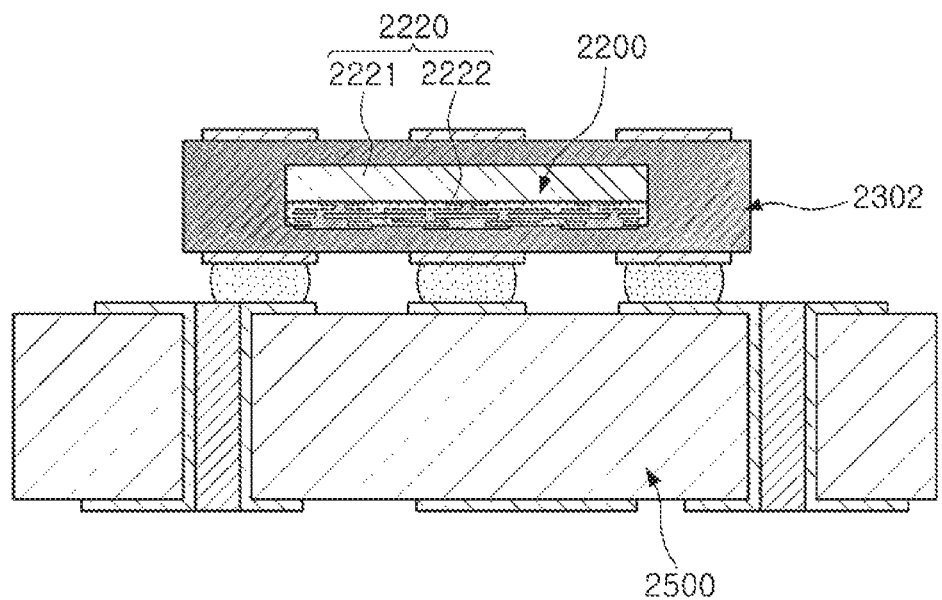
FIG. 6 is a schematic cross-sectional view illustrating a case in which a fan-in semiconductor package is embedded in an interposer substrate and is finally mounted on a main board of an electronic device.

FIG. 6 is a schematic cross-sectional view illustrating a case in which a fan-in semiconductor package is embedded in an interposer substrate and is finally mounted on a main board of an electronic device.

Referring to the drawings, in a fan-in semiconductor package 2200, connection pads 2222, that is, I/O terminals, of a semiconductor chip 2220 may be redistributed once more through an interposer substrate 2301, and the fan-in semiconductor package 2200 may be finally mounted on a main board 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed once more by the interposer substrate 2302 in a state in which the fan-in semiconductor package 2200 is embedded in the interposer substrate 2302, and the fan-in semiconductor package 2200 may be finally mounted on a main board 2500 of an electronic device.

As described above, it may be difficult to mount and use the fan-in semiconductor package directly on the main board of the electronic device. Therefore, the fan-in semiconductor package may be mounted on the separate interposer substrate and then be mounted on the main board of the electronic device through a packaging process or may be mounted and used on the main board of the electronic device in a state in which it is embedded in the interposer substrate.

(Fan-Out Semiconductor Package)

Figure 7:
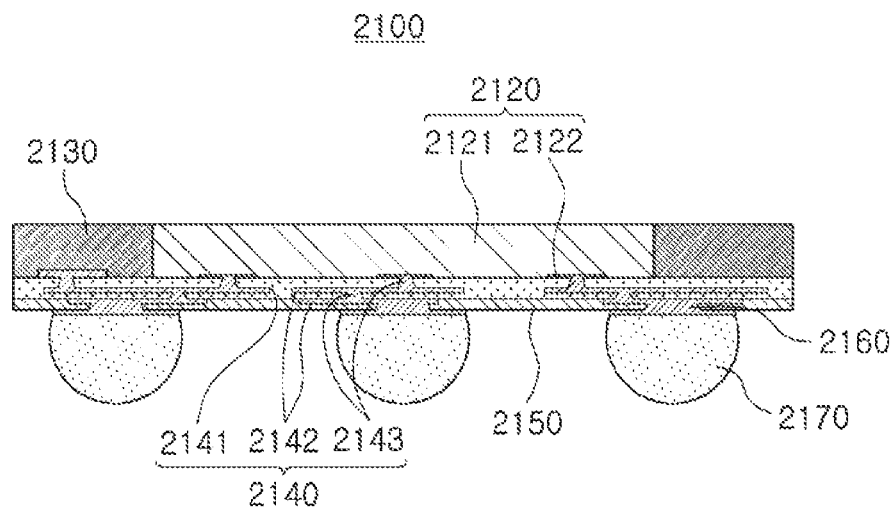
FIG. 7 is a schematic cross-sectional view illustrating a fan-out semiconductor package.

FIG. 7 is a schematic cross-sectional view illustrating a fan-out semiconductor package.

Referring to the drawing, in a fan-out semiconductor package 2100, an outer side of a semiconductor chip 2120, for example, may be protected by an encapsulant 2130, and connection pads 2122 of the semiconductor chip 2120 may be redistributed outwardly of the semiconductor chip 2120 by a connection member 2140. In this case, a passivation layer 2150 may then be formed on the connection member 2140, and an underbump metal layer 2160 may subsequently be formed in openings of the passivation layer 2150. Solder balls 2170 may then be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside of the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package may have the form in which the I/O terminals of the semiconductor chip are redistributed and disposed outwardly of the semiconductor chip through the connection member formed on the semiconductor chip, as described above. Therefore, even in a case that a size of the semiconductor chip is decreased, a standardized ball layout may be used in the fan-out semiconductor package as it is, such that the fan-out semiconductor package may be mounted on the main board of the electronic device without using a separate interposer substrate, as described below.

Figure 8:
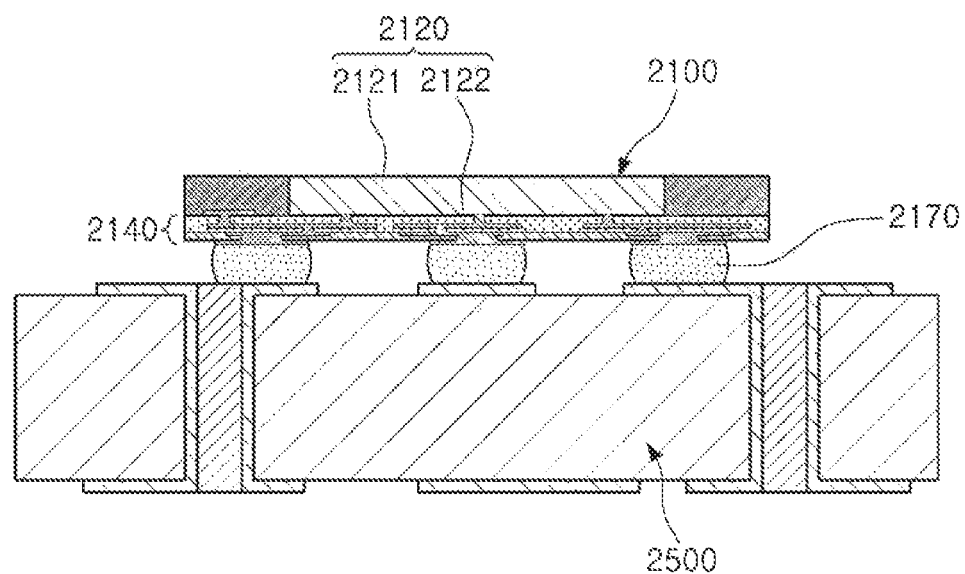
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to the drawing, a fan-out semiconductor package 2100 may be mounted on a main board 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented at a thickness less than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to an occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

A fan-out semiconductor package capable of simultaneously performing various functions and being miniaturized and thinned will hereinafter be described with reference to the drawings.

Figure 9:
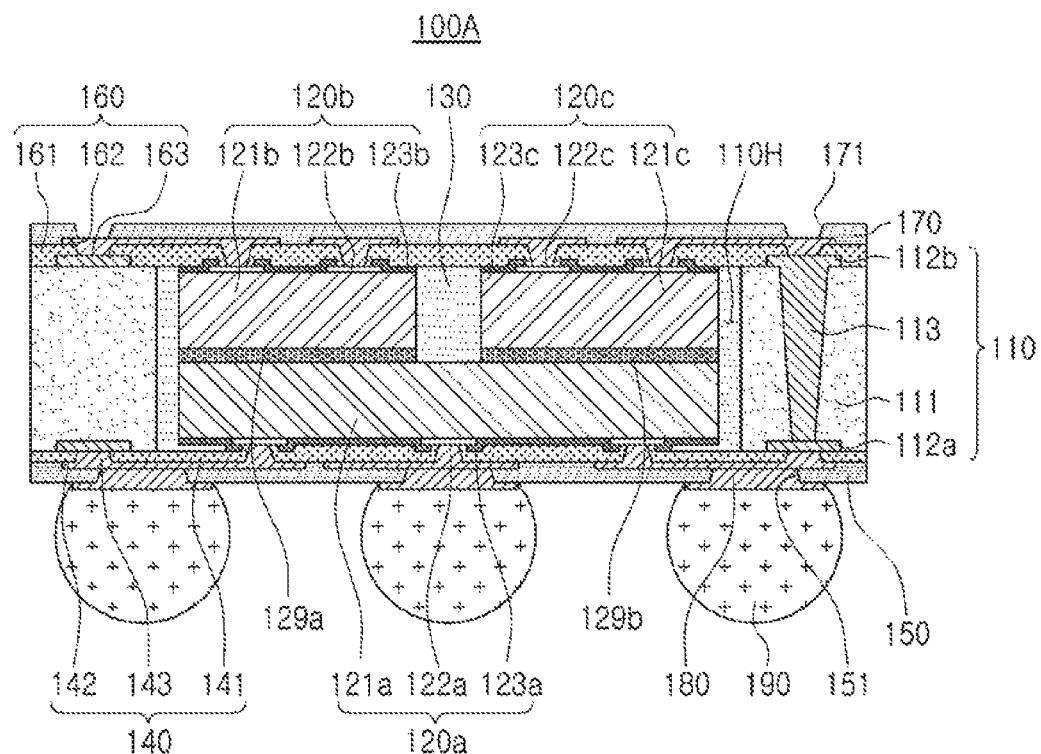
FIG. 9 is a schematic cross-sectional view illustrating an example of a fan-out semiconductor package.

FIG. 9 is a schematic cross-sectional view illustrating an example of a fan-out semiconductor package.

Figure 10:
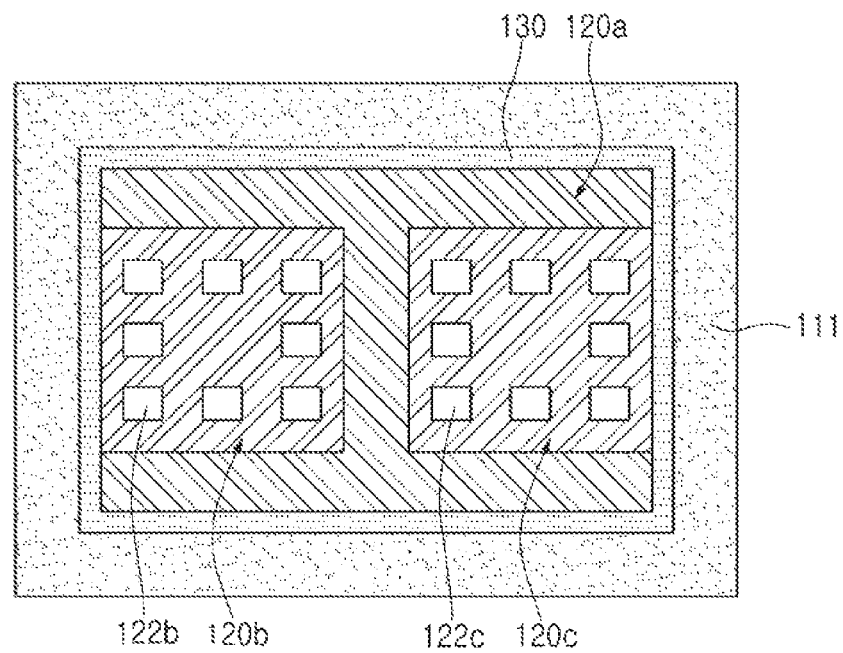
FIG. 10 is a schematic plan view of the fan-out semiconductor package of FIG. 9.

FIG. 10 is a schematic plan view of the fan-out semiconductor package of FIG. 9.

Referring to the drawings, a fan-out semiconductor package 100A according to an exemplary embodiment in the present disclosure may include a first connection member 110 having a through-hole 110H, a first component 120a disposed in the through-hole 110H, a plurality of second components 120b and 120c disposed in the through-hole 110H and attached to the first component 120a, an encapsulant 130 filling at least portions of spaces between walls of the through-hole 110H and side surfaces of the first component 120a and side surfaces of the plurality of second components 120b and 120c, a second connection member 140 disposed on the first connection member 110 and the first component 120a and including a redistribution layer 142 electrically connected to the first component 120a, and a third connection member 160 disposed on the first connection member 110 and the plurality of second components 120b and 120c and including a redistribution layer 162 electrically connected to the plurality of second components 120b and 120c. The second and third connection members 140 and 160 may be connected to each other through the first connection member 110. The first connection member 110 may include redistribution layers 112a and 112b electrically connected to the redistribution layer 142 of the second connection member 140 and the redistribution layer 162 of the third connection member 160, respectively.

Recently, in order to implement a package having various functions, a POP form, in which a first semiconductor chip is packaged in a wafer level package form and an interposer on which a second semiconductor chip is formed is stacked on the first semiconductor chip, has been developed. However, such a package-on-package form is not appropriate for a recent situation in which thinness is strongly demanded. In order to solve such a problem, it may be considered that a plurality of semiconductor chips may be disposed side by side and then packaged to be thus implemented as one package. Although such a side-by-side form enables thinness, it has a limitation in terms of miniaturization.

On the other hand, in the fan-out semiconductor package 100A according to the exemplary embodiment, the first connection member 110 having the through-hole 110H may be introduced, and a plurality of components 120a, 120b, and 120c may be disposed in a stacked form, of which space utilization is excellent, in the through-hole 110H. Therefore, the fan-out semiconductor package having various functions may be manufactured by utilizing a space as small as possible. In addition, the second connection member 140 having the redistribution layer 142 may be disposed on the first component 120a, the third connection member 160 having the redistribution layer 162 may be disposed on the plurality of second components 120b and 120c, and the second connection member 140 and the third connection member 160 may be electrically connected to each other through the first connection member 110 having the redistribution layers 112a and 112b. Therefore, a wiring design may also be performed by utilizing a space as small as possible, and the first connection member 110 may be used as a routing region for forming wirings, such that the fan-out semiconductor package having excellent performance in spite of having an ultra-miniature size and an ultra-thin thickness may be manufactured. In addition, alignment of a circuit configuration may be improved through the second connection member 140 and the third connection member 160, disposed at opposite sides of the fan-out semiconductor package 100A, to allow an upper portion and a lower portion of the fan-out semiconductor package 100A to be balanced, resulting in suppressing warpage. Since other spaces of the through-hole 110H may be filled with the encapsulant using an underfill process, or the like, it may be easy to balance in terms of a coefficient of thermal expansion (CTE) and shrinkage, such that an excellent warpage suppressing effect may be accomplished.

Meanwhile, the first component 120a may be a first semiconductor chip 120a having an active surface, having connection pads 122a disposed thereon, and an inactive surface opposing the active surface. In addition, the plurality of second components 120b and 120c may be second and third semiconductor chips 120b and 120c, each having active surfaces having connection pads 122b and 122c disposed thereon, and inactive surfaces opposing the active surfaces. The connection pads 122a of the first semiconductor chip 120a may be electrically connected to the redistribution layer 142 of the second connection member 140. The connection pads 122b and 122c of the second and third semiconductor chips 120b and 120c may be electrically connected to the redistribution layer 162 of the third connection member 160. The second and third semiconductor chips 120b and 120c may be attached to the inactive surface of the first semiconductor chip 120a through first and second adhesive members 129a and 129b, respectively, so that the inactive surfaces thereof face the inactive surface of the first semiconductor chip 120a. Each of the second and third semiconductor chips 120b and 120c may be smaller than the first semiconductor chip 120a, such that each of the second and third semiconductor chips 120b and 120c may fit on the inactive surface of the first semiconductor chip 120a. Therefore, several semiconductor chips 120a, 120b, and 120c, having various functions, may be stably mounted in one fan-out semiconductor package 100A. The first and second adhesive members 129a and 129b are not particularly limited, and may be the known adhesive films, epoxy resins, tapes, or the like.

The respective components included in the fan-out semiconductor package 100A according to the exemplary embodiment will hereinafter be described in more detail.

The first connection member 110 may connect the second connection member 140 and the third connection member 160 to each other. The first connection member 110 may include the redistribution layers 112a and 112b to thus reduce the number of layers of the second connection member 140 and the third connection member 160. The first connection member 110 may maintain rigidity of the fan-out semiconductor package 100A, depending on certain materials of the insulating layers 111a and 111b configuring the first connection member 110. The first connection member 110 may have the through-hole 110H. The first to third components 120a, 120b, and 120c may be disposed in a special form in the through-hole 110H. Side surfaces of the first to third components 120a, 120b, and 120c may be surrounded by the first connection member 110. However, such a form is only an example, and the through-hole 110H may be variously modified to have other forms, and the first connection member 110 may perform another function, depending on such a form.

The first connection member 110 may include an insulating layer 111, a first redistribution layer 112a embedded in the insulating layer 111, and a second redistribution layer 112b, disposed on the other surface of the insulating layer 111 opposing one surface of the insulating layer 111 in which the first redistribution layer 112a is embedded. The first connection member 110 may include vias 113 penetrating through the insulating layer 111 and electrically connecting the first and second redistribution layers 112a and 112b to each other. When the first redistribution layer 112a is embedded in the insulating layer 111, a step generated due to a thickness of the first redistribution layer 112a may be significantly reduced, and an insulating distance of the second connection member 140 may thus become constant. That is, a difference between a distance from the redistribution layer 142 of the second connection member 140 to a lower surface of the insulating layer 111 and a distance from the redistribution layer 142 of the second connection member 140 to the connection pad 122 of the semiconductor chip 120 may be smaller than a thickness of the first redistribution layer 112a. Therefore, a high density wiring design of the second connection member 140 may be easy to achieve.

A material of the insulating layer 111 is not particularly limited. For example, an insulating material may be used as the material of the insulating layer 111. In this case, the insulating material may be a thermosetting resin such as an epoxy resin, a thermoplastic resin such as a polyimide resin, or a resin in which the thermosetting resin or the thermoplastic resin is impregnated with an inorganic filler and/or a core material such as a glass cloth (or a glass fabric), for example, prepreg, Ajinomoto Build up Film (ABF), FR-4, Bismaleimide Triazine (BT), or the like. Alternatively, a photoimagable dielectric (PID) resin may also be used as the insulating material.

A material of each of the redistribution layers 112a and 112b may be a conductive material such as copper (Cu), aluminum (Al), silver (Ag), tin (Sn), gold (Au), nickel (Ni), lead (Pb), titanium (Ti), or alloys thereof. The redistribution layers 112a and 112b may perform various functions depending on designs of their corresponding layers. For example, the redistribution layers 112a and 112b may include ground (GND) patterns, power (PWR) patterns, signal (S) patterns, and the like. Here, the signal (S) patterns may include various signals, such as data signals, and the like, except for the ground (GND) patterns, the power (PWR) patterns, and the like. In addition, the redistribution layers 112a and 112b may include via pads, connection terminal pads, or the like.

The vias 113 may electrically connect the redistribution layers 112a and 112b, formed on different layers than each other, resulting in an electrical path in the first connection member 110. A material of each of the vias 113 may be a conductive material. Each of the vias 113 may be completely filled with the conductive material, or the conductive material may be formed along a wall of each of the via holes. In addition, each of the vias 113 may have all of the shapes known in the related art, such as a tapered shape, a cylindrical shape, and the like. Meanwhile, when holes for the vias 113 are formed, some of the pads of the first redistribution layer 112a may serve as a stopper, and it may thus be advantageous in the via hole-formation process that each of the vias 113 may have the tapered shape, of which a width of an upper surface is greater than that of a lower surface. In this case, the vias 113 may be integrated with the pad patterns of the second redistribution layer 112b.

The first component 120a and the plurality of second components 120b and 120c may be the first to third semiconductor chips 120a, 120b, and 120c that are either the same as or different from each other. The first to third semiconductor chips 120a, 120b, and 120c may be integrated circuits (ICs) provided in an amount of several hundreds to several millions of elements or more, integrated in a single chip, respectively. The first to third semiconductor chips 120a, 120b, and 120c may be formed on the basis of active wafers. In this case, a base material of each of bodies 121a, 121b, and 121c may be silicon (Si), germanium (Ge), gallium arsenide (GaAs), or the like. Various circuits may be formed on the bodies 121a, 121b, and 121c. A material of each of the connection pads 122a, 122b, and 122c is not particularly limited, but may be a conductive material such as aluminum (Al). Each of passivation layers 123a, 123b, and 123c may be an oxide film, a nitride film, or the like, or be a double layer of an oxide layer and a nitride layer. Another insulating layer (not illustrated), and the like, may also be further disposed.

The first to third semiconductor chips 120a, 120b, and 120c may be application processors (APs) such as central processors (for example, CPUs), graphic processors, (for example, GPUs), fieldprogrammable gate arrays (FPGAs), digital signal processors, cryptographic processors, micro processors, or micro controllers, respectively. Alternatively, the first to third semiconductor chips 120a, 120b, and 120c may be memories such as volatile memories (for example, DRAMs), non-volatile memories (for example, ROMs), or flash memories (for example, a negative AND (NAND) flash memory), respectively. For example, the first semiconductor chip 120a may be a flash memory such as a negative AND (NAND) flash memory, the second semiconductor chip 120b may be a volatile memory such as a DRAM, and the third semiconductor chip 120c may be a controller. However, the first to third semiconductor chips are not limited thereto, but may also be other kinds of elements, depending on designs.

The encapsulant 130 may encapsulate the first component 120a and the plurality of second components 120b and 120c. The encapsulant 130 may include the known underfill resin. Alternatively, the encapsulant 130 may include a known epoxy resin used as a molding material. A material including an inorganic filler and an insulating resin, for example, a thermosetting resin such as an epoxy resin, a thermoplastic resin such as a polyimide resin, or a resin having a reinforcing material such as an inorganic filler impregnated with the thermosetting resin and the thermoplastic resin, may be used as the material of the encapsulant 130, if necessary. The encapsulant 130 may fill at least portions of spaces between the walls of the through-hole 110H and the side surfaces of the first component 120a and the side surfaces of the plurality of second components 120b and 120c.

The second connection member 140 may redistribute at least the connection pads 122a of the first component 120a. The second connection member 140 may include insulating layers 141, the redistribution layers 142 disposed on the insulating layers 141, and vias 143 penetrating through the insulating layers 141 and connecting the redistribution layers 142 to each other. The second connection member 140 is not necessarily formed of a single layer, but may be formed of a plurality of layers, depending on a design. Meanwhile, when the second connection member 140 is formed of the plurality of layers, a thin copper layer may be formed additionally in any one redistribution layer for the purpose of heat dissipation.

A material of each of the insulating layers 141 may be an insulating material. In this case, the insulating material may be a photosensitive insulating material such as a photoimagable dielectric (PID) resin. That is, the insulating layer 141 may be a photosensitive insulating layer. When the insulating layer 141 has photosensitive properties, the insulating layer 141 may be formed to have a thinner thickness, and a fine pitch of the via 143 may be achieved more easily. When the insulating layers 141 are multiple layers, materials of the insulating layers 141 may be the same as each other, and may also be different from each other, if necessary. When the insulating layers 141 are the multiple layers, the insulating layers 141 may be integrated with each other depending on a process, such that a boundary therebetween may not be apparent.

A material of each of the redistribution layers 142 may be a conductive material such as copper (Cu), aluminum (Al), silver (Ag), tin (Sn), gold (Au), nickel (Ni), lead (Pb), titanium (Ti), or alloys thereof. The redistribution layers 142 may perform various functions, depending on designs of their corresponding layers. For example, the redistribution layers 142 may include ground (GND) patterns, power (PWR) patterns, signal (S) patterns, and the like. Here, the signal (S) patterns may include various signals, such as data signals, and the like, except for the ground (GND) patterns, the power (PWR) patterns, and the like. In addition, the redistribution layers 142 may include via pads, connection terminal pads, and the like.

The vias 143 may electrically connect the redistribution layers 142, the connection pads 122a, and the like, formed on different layers from each other. A material of each of the vias 143 may be a conductive material such as copper (Cu), aluminum (Al), silver (Ag), tin (Sn), gold (Au), nickel (Ni), lead (Pb), titanium (Ti), or alloys thereof. Each of the vias 143 may be completely filled with the conductive material, or the conductive material may be formed along a wall of each of the vias. In addition, each of the vias 143 may have all of the shapes known in the related art, such as a tapered shape, a cylindrical shape, and the like.

A passivation layer 150 may be additionally configured to protect the second connection member 140 from external physical or chemical damage. The passivation layer 150 may have openings 151 exposing at least portions of the redistribution layer 142 of the second connection member 140. The number of openings 151 formed in the passivation layer 150 may be several tens to several thousands. For example, a material of the passivation layer 150 may be ABF that does not include a glass cloth (or a glass fabric), but includes an inorganic filler and an insulating resin, or the like. However, the material of the passivation layer 150 is not limited thereto, but may also be a material including a glass cloth (or a glass fabric), if necessary.

The third connection member 160 may redistribute at least the connection pads 122b and 122c of the plurality of second components 120b and 120c. The third connection member 160 may include insulating layers 161, the redistribution layers 162 disposed on the insulating layers 161, and vias 163 penetrating through the insulating layers 161 and connecting the redistribution layers 162 to each other. The third connection member 160 is not necessarily formed of a single layer, but may be formed of a plurality of layers depending on a design. Meanwhile, when the third connection member 160 is formed of the plurality of layers, a thin copper layer may be formed additionally in any one redistribution layer for the purpose of heat dissipation. Meanwhile, the fan-out semiconductor package 100A may be applied to a POP, due to the existence of the third connection member 160. For example, solder balls, or the like, may be formed on the redistribution layer 162 of the third connection member 160 exposed through openings 171 of a passivation layer 170, and the fan-out semiconductor package 100A may be connected to another package using the solder balls, or the like.

A material of each of the insulating layers 161 may be an insulating material. In this case, the insulating material may be a photosensitive insulating material such as a PID resin. That is, the insulating layer 161 may be a photosensitive insulating layer. When the insulating layer 161 has photosensitive properties, the insulating layer 161 may be formed to be less thick, and a fine pitch of the via 163 may be achieved more easily. When the insulating layers 161 are multiple layers, materials of the insulating layers 161 may be the same as each other, and may also be different from each other, if necessary. When the insulating layers 161 are the multiple layers, the insulating layers 161 may be integrated with each other depending on a process used, such that a boundary therebetween may not be apparent.

A material of each of the redistribution layers 162 may be a conductive material such as copper (Cu), aluminum (Al), silver (Ag), tin (Sn), gold (Au), nickel (Ni), lead (Pb), titanium (Ti), or alloys thereof. The redistribution layers 162 may perform various functions, depending on designs of their corresponding layers. For example, the redistribution layers 162 may include ground (GND) patterns, power (PWR) patterns, signal (S) patterns, and the like. Here, the signal (S) patterns may include various signals, such as data signals, and the like, except for the ground (GND) patterns, the power (PWR) patterns, and the like. In addition, the redistribution layers 162 may include via pads, connection terminal pads, and the like.

The vias 163 may electrically connect the redistribution layers 162, the connection pads 122b and 122c, and the like, formed on different layers from each other. A material of each of the vias 163 may be a conductive material such as copper (Cu), aluminum (Al), silver (Ag), tin (Sn), gold (Au), nickel (Ni), lead (Pb), titanium (Ti), or alloys thereof. Each of the vias 163 may be completely filled with the conductive material, or the conductive material may also be formed along a wall of each of the vias. In addition, each of the vias 163 may have all of the shapes known in the related art, such as a tapered shape, a cylindrical shape, and the like.

The passivation layer 170 may be additionally configured to protect the third connection member 160 from external physical or chemical damage. The passivation layer 170 may have the openings 171 exposing at least portions of the redistribution layer 162 of the third connection member 160. The number of openings 171 formed in the passivation layer 170 may be several tens to several thousands. For example, a material of the passivation layer 170 may be ABF that does not include a glass cloth (or a glass fabric), but includes an inorganic filler and an insulating resin, or the like. However, the material of the passivation layer 170 is not limited thereto, but may also be a material including a glass cloth (or a glass fabric), if necessary.

Thicknesses of the redistribution layers 112a and 112b of the first connection member 110 may be greater than those of the redistribution layers 142 of the second connection member 140 and the redistribution layers 162 of the third connection member 160. Since the first connection member 110 may have a significant thickness, the redistribution layers 112a and 112b formed in the first connection member 110 may be formed in large sizes by a substrate process, or the like, depending on a scale of the first connection member 110. On the other hand, the redistribution layers 142 of the second connection member 140 and the redistribution layers 162 of the third connection member 160 may be formed in sizes relatively smaller than those of the redistribution layers 112a and 112b of the first connection member 110 by a semiconductor process, or the like, in order to thin the second connection member 140 and the third connection member 160.

An underbump metal layer 180 may be additionally configured to improve connection reliability of connection terminals 190 and improve board level reliability of the fan-out semiconductor package 100A. The underbump metal layer 180 may be connected to the redistribution layer 142 of the second connection member 140, exposed through the openings 151 of the passivation layer 150. The underbump metal layer 180 may be formed in the openings 151 of the passivation layer 150 by the known metallization method using a known conductive material such as a metal, but is not limited thereto.

The connection terminals 190 may be additionally configured to physically or electrically, externally connect the fan-out semiconductor package 100A. For example, the fan-out semiconductor package 100A may be mounted on the main board of the electronic device through the connection terminals 190. Each of the connection terminals 190 may be formed of a conductive material, for example, a solder, or the like. However, this is only an example, and a material of each of the connection terminals 190 is not particularly limited thereto. Each of the connection terminals 190 may be a land, a ball, a pin, or the like. The connection terminals 190 may be formed as a multilayer or single layer structure. When the connection terminals 190 are formed as a multilayer structure, the connection terminals 190 may include a copper (Cu) pillar and a solder. When the connection terminals 190 are formed as a single layer structure, the connection terminals 190 may include a tin-silver solder or copper (Cu). However, this is only an example, and the connection terminals 190 are not limited thereto.

The number, an interval, a disposition, or the like, of the connection terminals 190 is not particularly limited, and may be sufficiently modified by a person skilled in the art, depending on design particulars. For example, the connection terminals 190 may be provided in an amount of several tens to several thousands, according to the numbers of connection pads 122, or may be provided in an amount of several tens to several thousands or more or several tens to several thousands or less. When the connection terminals 190 are solder balls, the connection terminals 190 may cover side surfaces of the underbump metal layer 180 extending onto one surface of the passivation layer 150, and connection reliability may be excellent.

At least one of the connection terminals 190 may be disposed in a fan-out region. The fan-out region is a region except for the region in which the semiconductor chip 120 is disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to be thin, and may be price competitive.

Although not illustrated in the drawings, a metal layer may be further disposed on an inner wall of the through-hole 110H of the first connection member 110, if necessary. The metal layer may effectively dissipate heat generated from the first component 120a, the plurality of second components 120b and 120c, and the like, upwardly and/or downwardly of the fan-out semiconductor package 100A, and effectively block electromagnetic waves.

Figure 11:
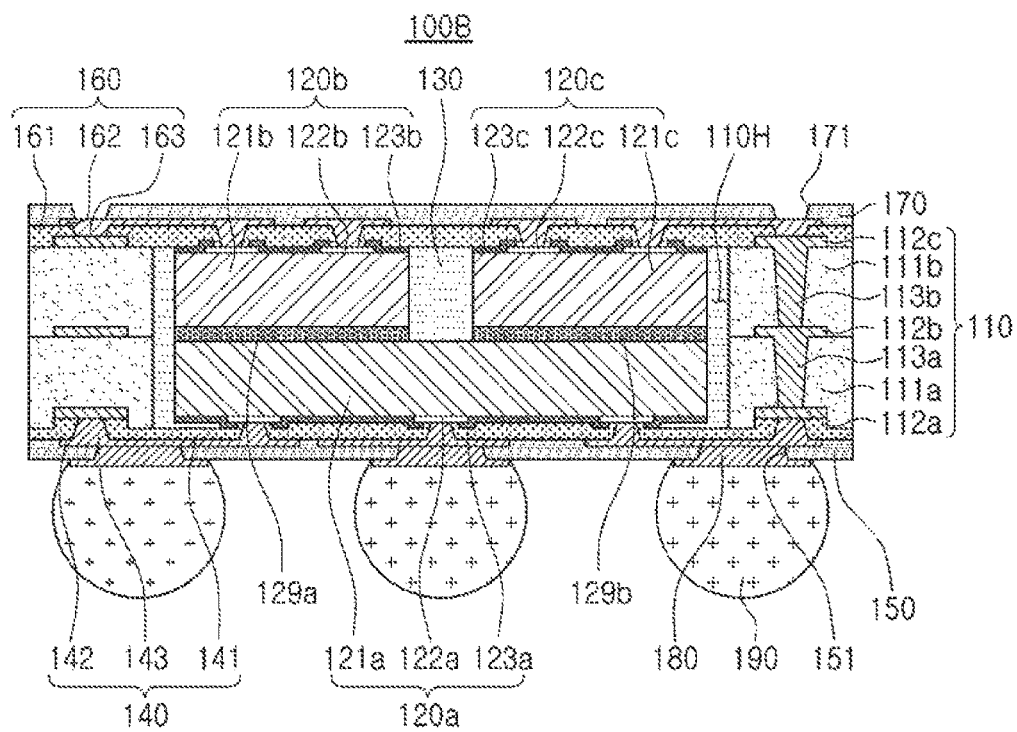
FIG. 11 is a schematic cross-sectional view illustrating a modified example of the fan-out semiconductor package of FIG. 9.

FIG. 11 is a schematic cross-sectional view illustrating a modified example of the fan-out semiconductor package of FIG. 9.

Referring to the drawing, in a fan-out semiconductor package 100B according to the modified example, a first connection member 110 may include a first insulating layer 111a, a first redistribution layer 112a embedded in the first insulating layer 111a, a second redistribution layer 112b disposed on the other surface of the first insulating layer 111a, opposing one surface of the first insulating layer 111a in which the first redistribution layer 112a is embedded, a second insulating layer 111b disposed on the first insulating layer 111a and covering the second redistribution layer 112b, and a third redistribution layer 112c disposed on the second insulating layer 111b. The first to third redistribution layers 112a, 112b, and 112c may be electrically connected to connection pads 122. The first and second redistribution layers 112a and 112b and the second and third redistribution layers 112b and 112c may be electrically connected to each other through first and second vias 113a and 113b, penetrating through the first and second insulating layers 111a and 111b, respectively.

Since the first redistribution layer 112a is embedded in the first insulating layer 111a, an insulating distance of an insulating layer 141 of a second connection member 140 may be substantially constant. Since the first connection member 110 may include a large number of redistribution layers 112a, 112b, and 112c, the second connection member 140 and a third connection member 160 may be further simplified. Therefore, a decrease in a yield depending on a defect occurring in a process of forming the second connection member 140 and the third connection member 160 may be suppressed, and the second connection member 140 and the third connection member 160 may be thinned. The first redistribution layer 112a may be recessed into the first insulating layer 111a, such that a lower surface of the first insulating layer 111a and a lower surface of the first redistribution layer 112a have a step therebetween. As a result, when an encapsulant 130 is formed, a phenomenon in which a material of the encapsulant 130 bleeds to pollute the first redistribution layer 112a may be sufficiently prevented.

A material of each of the insulating layers 111a and 111b is not particularly limited. For example, an insulating material may be used as the material of each of the insulating layers 111a and 111b. In this case, the insulating material may be a thermosetting resin such as an epoxy resin, a thermoplastic resin such as a polyimide resin, a resin in which the thermosetting resin or the thermoplastic resin is impregnated with an inorganic filler or a core material such as a glass fiber (or a glass cloth or a glass fabric), for example, prepreg, ABF, FR-4, BT, or the like. Alternatively, a PID resin may also be used as the insulating material.

A material of each of the redistribution layers 112a, 112b, and 112c may be a conductive material such as copper (Cu), aluminum (Al), silver (Ag), tin (Sn), gold (Au), nickel (Ni), lead (Pb), titanium (Ti), or alloys thereof. The redistribution layers 112a, 112b, and 112c may perform various functions, depending on designs of their corresponding layers. For example, the redistribution layers 112a, 112b, and 112c may include ground (GND) patterns, power (PWR) patterns, signal (S) patterns, and the like. Here, the signal (S) patterns may include various signals, such as data signals, and the like, except for the ground (GND) patterns, the power (PWR) patterns, and the like. In addition, the redistribution layers 112a, 112b, and 112c may include via pads, connection terminal pads, and the like.

The vias 113a and 113b may electrically connect the redistribution layers 112a, 112b, and 112c formed on different layers from each other, resulting in an electrical path in the first connection member 110. A material of each of the vias 113a and 113b may be a conductive material. Each of the vias 113a and 113b may be completely filled with the conductive material, or the conductive material may be formed along a wall of each of via holes. In addition, each of the vias 113a and 113b may be in any of the shapes known in the related art, such as a tapered shape, a cylindrical shape, and the like. Meanwhile, when holes for the vias 113a and 113b are formed, some of the pads of the first redistribution layer 112a and the second redistribution layer 112b may serve as a stopper, and thus it may be advantageous in a process in which each of the vias 113a and 113b is formed to have the tapered shape of which a width of an upper surface is greater than that of a lower surface. In this case, the vias 113a and 113b may be integrated with portions of the second redistribution layer 112b and the third redistribution layer 112c, respectively.

A lower surface of the first redistribution layer 112a of the first connection member 110 may be disposed on a level above a lower surface of the connection pad 122 of a first semiconductor chip 120a. In addition, a distance between a redistribution layer 142 of the second connection member 140 and the first redistribution layer 112a of the first connection member 110 may be greater than that between the redistribution layer 142 of the second connection member 140 and the connection pad 122 of the first semiconductor chip 120a. This is due to the fact that the first redistribution layer 112a may be recessed into the insulating layer 111. The second redistribution layer 112b of the first connection member 110 may be disposed on a level between the second connection member 140 and the third connection member 160, and may not be connected to the second connection member 140 and the third connection member 160. This is due to the fact that the first connection member 110 may be configured in a multilayer form.

Thicknesses of the redistribution layers 112a, 112b, and 112c of the first connection member 110 may be greater than those of the redistribution layers 142 of the second connection member 140 and redistribution layers 162 of the third connection member 160. Since the first connection member 110 may have a significant thickness, the redistribution layers 112a, 112b, and 112c may be formed in large sizes by a substrate process, or the like, depending on a scale of the first connection member 110. On the other hand, the redistribution layers 142 of the second connection member 140 and the redistribution layers 162 of the third connection member 160 may be may be formed in sizes relatively smaller than those of the redistribution layers 112a, 112b, and 112c of the first connection member 110 by a semiconductor process, or the like, for thinness. A description of other configurations overlapping those described above in the fan-out semiconductor package 100A will be omitted.

Figure 12:
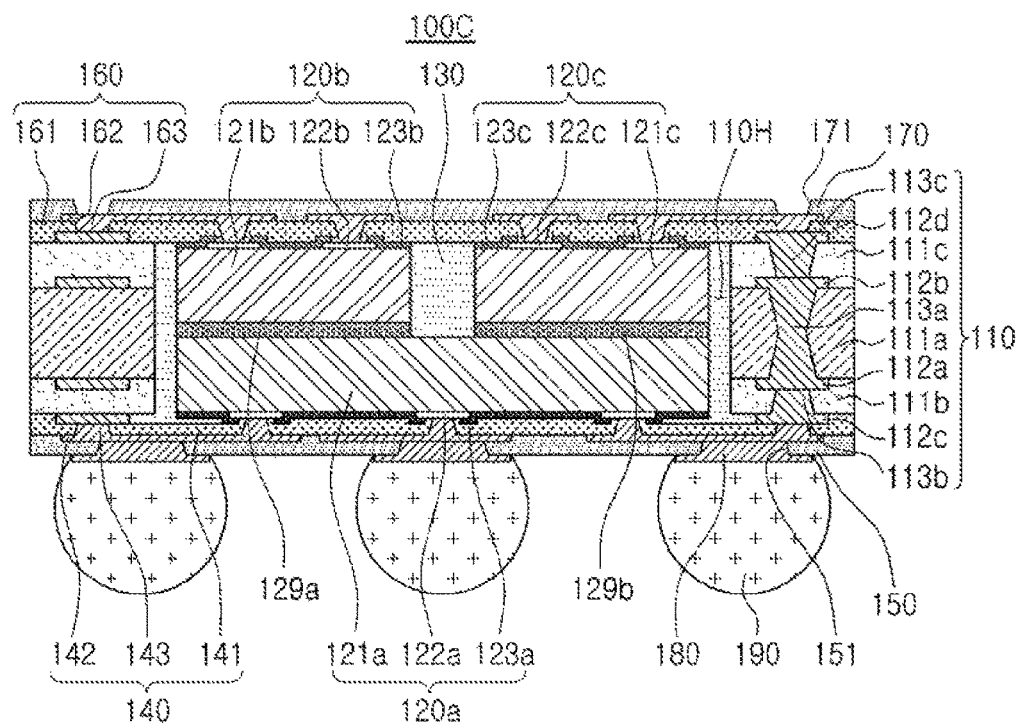
FIG. 12 is a schematic cross-sectional view illustrating another modified example of the fan-out semiconductor package of FIG. 9.

FIG. 12 is a schematic cross-sectional view illustrating another modified example of the fan-out semiconductor package of FIG. 9.

Referring to the drawing, in a fan-out semiconductor package 100C according to another modified example, a first connection member 110 may include a first insulating layer 111a, a first redistribution layer 112a and a second redistribution layer 112b disposed on opposite surfaces of the first insulating layer 111a, respectively, a second insulating layer 111b disposed on the first insulating layer 111a and covering the first redistribution layer 112a, a third redistribution layer 112c disposed on the second insulating layer 111b, a third insulating layer 111c disposed on the first insulating layer 111a and covering the second redistribution layer 112b, and a fourth redistribution layer 112d disposed on the third insulating layer 111c. The first to fourth redistribution layers 112a, 112b, 112c, and 112d may be electrically connected to connection pads 122. Since the first connection member 110 may include a larger number of redistribution layers 112a, 112b, 112c, and 112d, a second connection member 140 may be further simplified. Therefore, a decrease in a yield, depending on a defect occurring in a process of forming the second connection member 140, may be suppressed. The first to fourth redistribution layers 112a, 112b, 112c, and 112d may be electrically connected to each other through first to third vias 113a, 113b, and 113c penetrating through the first to third insulating layers 111a, 111b, and 111c, respectively.

The first insulating layer 111a may have a thickness greater than those of the second insulating layer 111b and the third insulating layer 111c. The first insulating layer 111a may be relatively thick in order to maintain rigidity, and the second insulating layer 111b and the third insulating layer 111c may be introduced in order to form a larger number of redistribution layers 112c and 112d. The first insulating layer 111a may include an insulating material different from those of the second insulating layer 111b and the third insulating layer 111c. For example, the first insulating layer 111a may be, for example, prepreg including a core material, an inorganic filler, and an insulating resin, and the second insulating layer 111b and the third insulating layer 111c may be an ABF or a photosensitive insulating film including an inorganic filler and an insulating resin. However, the materials of the first insulating layer 111a and the second and third insulating layers 111b and 111c are not limited thereto. Meanwhile, the first insulating layer 111a may have a thickness greater than those of the second insulating layer 111b and the third insulating layer 111c, and the first via 113a may have a size greater than those of the second via 113b and the third via 113c.

A material of each of the redistribution layers 112a, 112b, 112c, and 112d may be a conductive material such as copper (Cu), aluminum (Al), silver (Ag), tin (Sn), gold (Au), nickel (Ni), lead (Pb), titanium (Ti), or alloys thereof. The redistribution layers 112a, 112b, 112c, and 112d may perform various functions, depending on designs of their corresponding layers. For example, the redistribution layers 112a, 112b, 112c, and 112d may include ground (GND) patterns, power (PWR) patterns, signal (S) patterns, and the like. Here, the signal (S) patterns may include various signals, such as data signals, and the like, except for the ground (GND) patterns, the power (PWR) patterns, and the like. In addition, the redistribution layers 112a, 112b, 112c, and 112d may include via pads, connection terminal pads, and the like.

The vias 113a, 113b, and 113c may electrically connect the redistribution layers 112a, 112b, 112c, and 112d formed on different layers from each other, resulting in an electrical path in the first connection member 110. A material of each of the vias 113a, 113b, and 113c may be a conductive material. Each of the vias 113a, 113b, and 113c may be completely filled with the conductive material, or the conductive material may be formed along a wall of each of via holes. The first via 113a may be a through-via having a sandglass shape, a cylindrical shape, or the like, and the second via 113b and the third via 113c may be blind vias having a tapered shape, or the like.

A lower surface of the third redistribution layer 112c of the first connection member 110 may be disposed on a level below a lower surface of the connection pad 122 of a first semiconductor chip 120a. In addition, a distance between a redistribution layer 142 of the second connection member 140 and the third redistribution layer 112c of the first connection member 110 may be less than that between the redistribution layer 142 of the second connection member 140 and the connection pad 122 of the first semiconductor chip 120a. The reason is that the third redistribution layer 112c may be disposed in a protruding form on the second insulating layer 111b, resulting in contact with the second connection member 140. The first redistribution layer 112a and the second redistribution layer 112b of the first connection member 110 may be disposed on a level between the second connection member 140 and a third connection member 160, and may not be in contact with the second connection member 140 and the third connection member 160.

Thicknesses of the redistribution layers 112a, 112b, 112c, and 112d of the first connection member 110 may be greater than those of the redistribution layers 142 of the second connection member 140 and redistribution layers 162 of the third connection member 160. The redistribution layers 112*a*, 112*b*, 112*c*, and 112*d* may be formed in large sizes by a substrate process, or the like, depending on a scale of the first connection member 110. On the other hand, the redistribution layers 142 of the second connection member 140 and the redistribution layers 162 of the third connection member 160 may be may be formed in sizes relatively smaller than those of the redistribution layers 112*a*, 112*b*, 112*c*, and 112*d* of the first connection member 110 by a semiconductor process, or the like, for thinness. A description of other configurations overlapping those described above in the fan-out semiconductor package 100A will be omitted.

Figure 13:
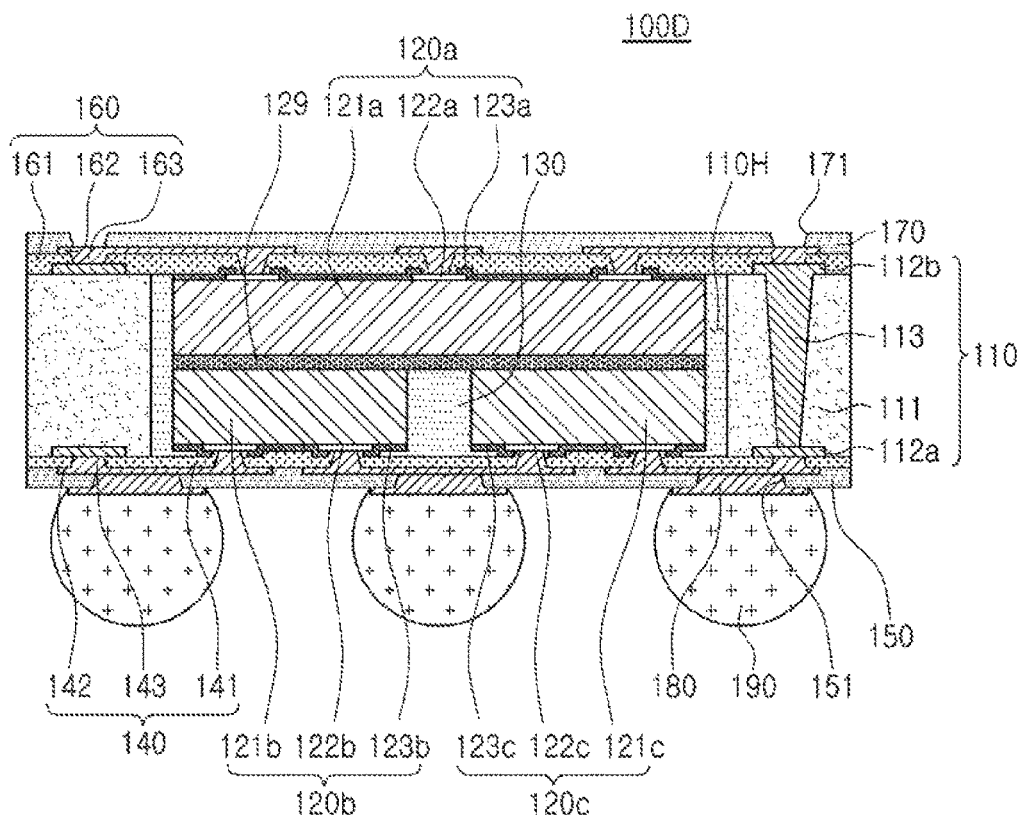
FIG. 13 is a schematic cross-sectional view illustrating another example of a fan-out semiconductor package.

FIG. 13 is a schematic cross-sectional view illustrating another example of a fan-out semiconductor package.

Figure 14:
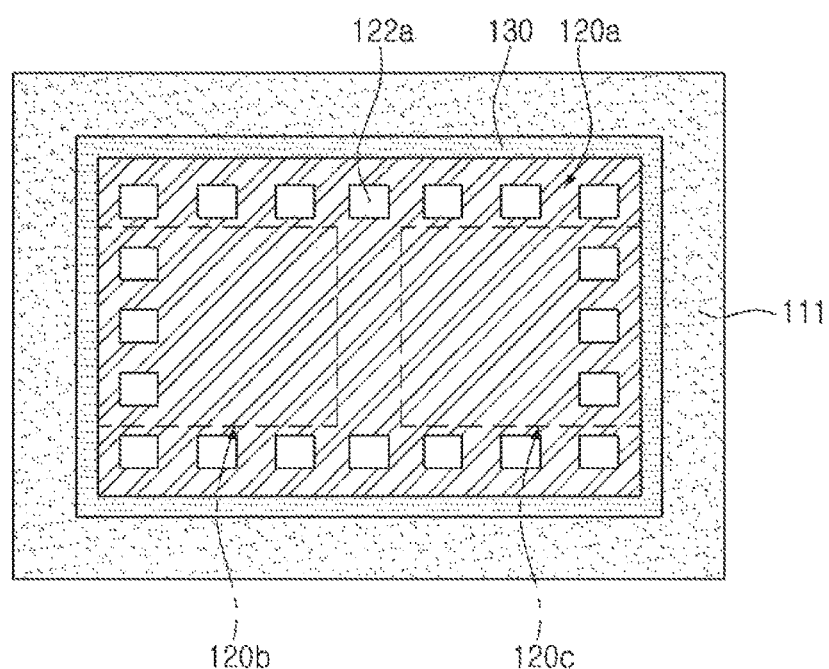
FIG. 14 is a schematic plan view of the fan-out semiconductor package of FIG. 13.

FIG. 14 is a schematic plan view of the fan-out semiconductor package of FIG. 13.

Referring to the drawing, in a fan-out semiconductor package 100D according to another exemplary embodiment in the present disclosure, positions of a first component 120*a* and a plurality of second components 120*b* and 120*c* are the inverse of those of the fan-out semiconductor package 100A, according to the exemplary embodiment described above. That is, a disposition sequence of the components 120*a*, 120*b*, and 120*c* may be changed, if necessary. The plurality of second components 120*b* and 120*c* may be attached to the first component 120*a* through one adhesive member 129, but are not limited thereto. A third connection member 160 may be disposed on the first component 120*a*, and a second connection member 140 may be disposed on the plurality of second components 120*b* and 120*c*. The second connection member 140 and the third connection member 160 may be connected to each other through a first connection member 110. A description of other configurations overlapping those described above in the fan-out semiconductor package 100A will be omitted.

Figure 15:
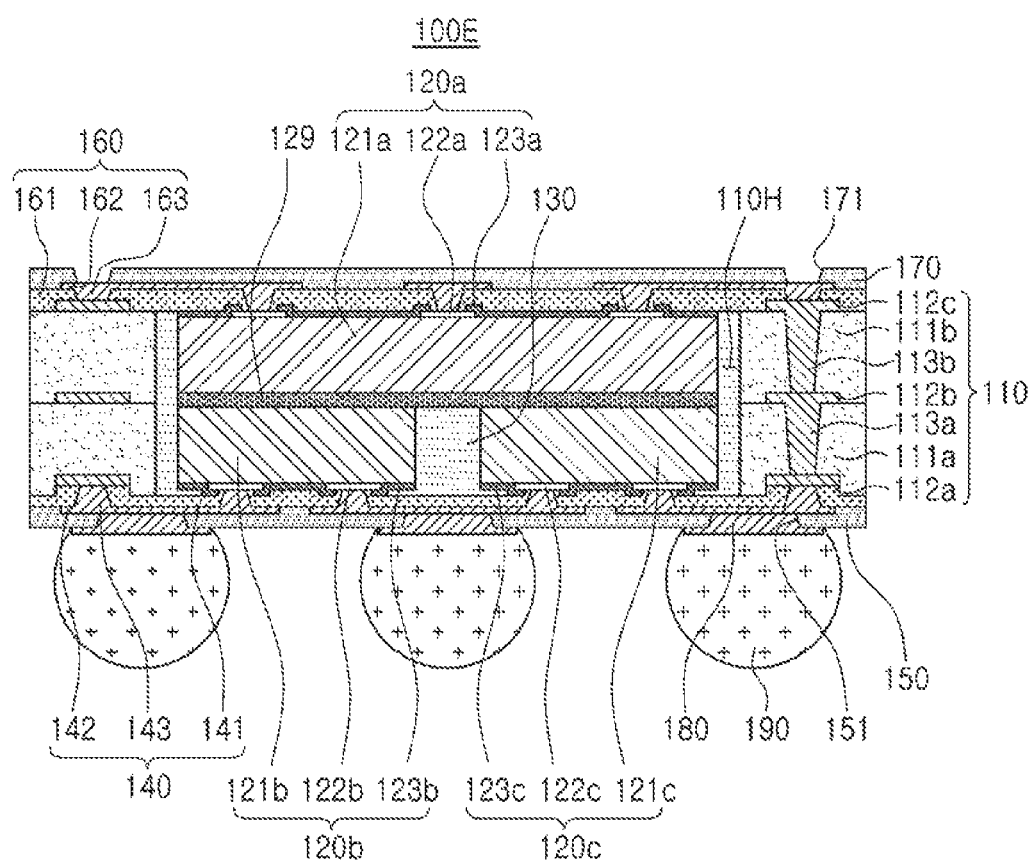
FIG. 15 is a schematic cross-sectional view illustrating a modified example of the fan-out semiconductor package of FIG. 13.

FIG. 15 is a schematic cross-sectional view illustrating a modified example of the fan-out semiconductor package of FIG. 13.

Referring to the drawing, in a fan-out semiconductor package 100E according to the modified example, a first connection member 110 may include a first insulating layer 111*a*, a first redistribution layer 112*a* embedded in the first insulating layer 111*a*, a second redistribution layer 112*b* disposed on the other surface of the first insulating layer 111*a* opposing one surface of the first insulating layer 111*a* in which the first redistribution layer 112*a* is embedded, a second insulating layer 111*b* disposed on the first insulating layer 111*a* and covering the second redistribution layer 112*b*, and a third redistribution layer 112*c* disposed on the second insulating layer 111*b*. The first and second redistribution layers 112*a* and 112*b* and the second and third redistribution layers 112*b* and 112*c* may be electrically connected to each other through first and second vias 113*a* and 113*b* penetrating through the first and second insulating layers 111*a* and 111*b*, respectively. A description of other configurations overlapping those described above in the fan-out semiconductor packages 100A, 100B, and 100D will be omitted.

Figure 16:
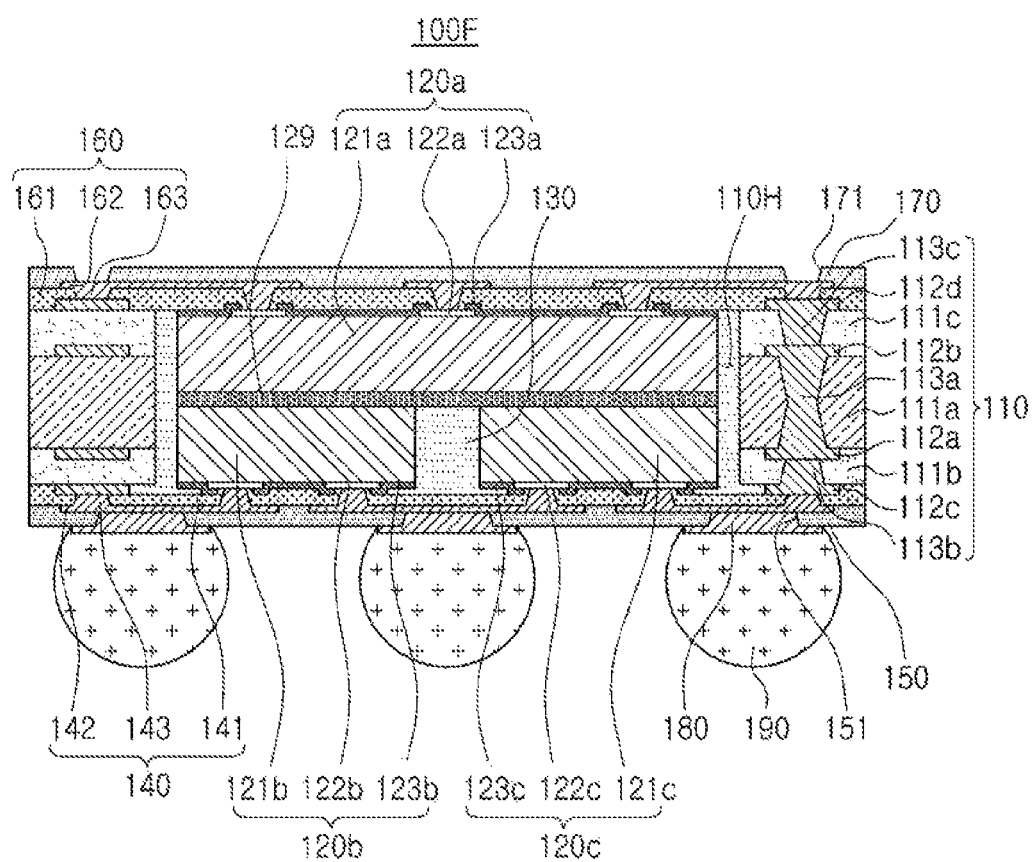
FIG. 16 is a schematic cross-sectional view illustrating another modified example of the fan-out semiconductor package of FIG. 13.

FIG. 16 is a schematic cross-sectional view illustrating another modified example of the fan-out semiconductor package of FIG. 13.

Referring to the drawing, in a fan-out semiconductor package 100F according to another modified example, a first connection member 110 may include a first insulating layer 111*a*, a first redistribution layer 112*a* and a second redistribution layer 112*b* disposed on opposite surfaces of the first insulating layer 111*a*, respectively, a second insulating layer 111*b* disposed on the first insulating layer 111*a* and covering the first redistribution layer 112*a*, a third redistribution layer 112*c* disposed on the second insulating layer 111*b*, a third insulating layer 111*c* disposed on the first insulating layer 111*a* and covering the second redistribution layer 112*b*, and a fourth redistribution layer 112*d* disposed on the third insulating layer 111*c*. The first to fourth redistribution layers 112*a*, 112*b*, 112*c*, and 112*d* may be electrically connected to each other through first to third vias 113*a*, 113*b*, and 113*c* penetrating through the first to third insulating layers 111*a*, 111*b*, and 111*c*, respectively. A description of other configurations overlapping those described above in the fan-out semiconductor packages 100A, 100C, and 100D will be omitted.

Figure 17:
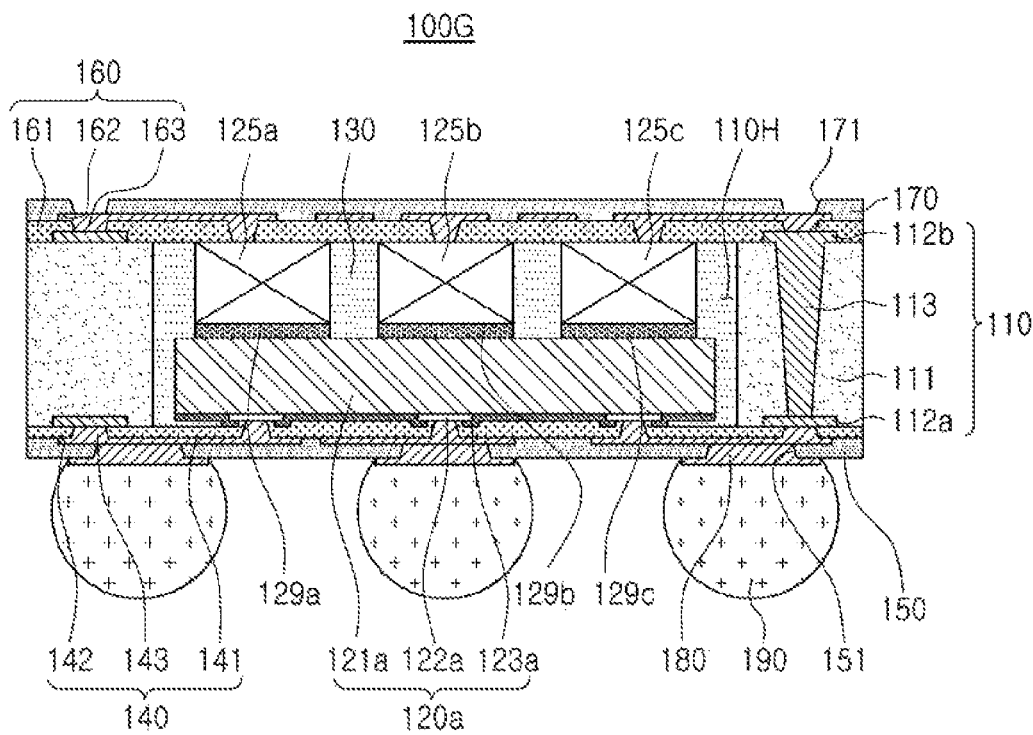
FIG. 17 is a schematic cross-sectional view illustrating another example of a fan-out semiconductor package.

FIG. 17 is a schematic cross-sectional view illustrating another example of a fan-out semiconductor package.

Figure 18:
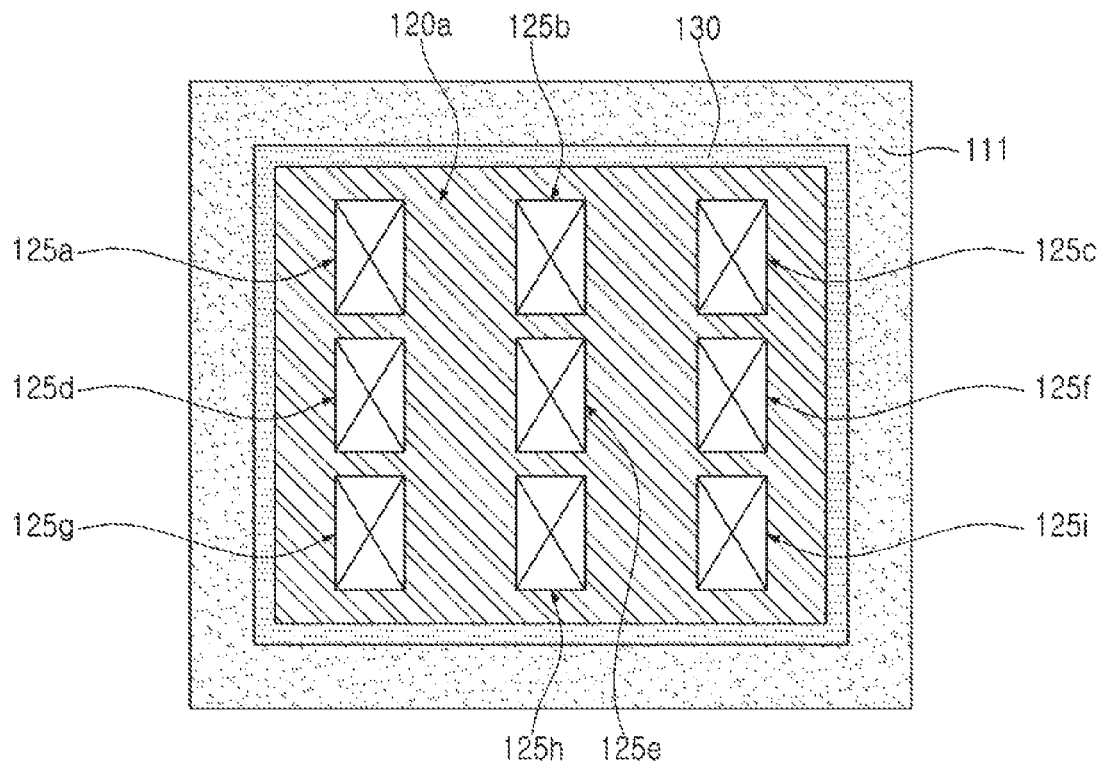
FIG. 18 is a schematic plan view of the fan-out semiconductor package of FIG. 17.

FIG. 18 is a schematic plan view of the fan-out semiconductor package of FIG. 17.

Referring to the drawings, in a fan-out semiconductor package 100G according to another exemplary embodiment in the present disclosure, a plurality of second components 125*a*-125*i* may be a plurality of passive components 125*a*-125*i*, unlike the fan-out semiconductor package 100A according to the exemplary embodiment described above. The plurality of passive components 125*a*-125*i* may be the same as or different from each other. For example, the plurality of passive components 125*a*-125*i* may be the known passive components such as capacitors, inductors, or the like, respectively. The respective passive components 125-125*i* may be attached to a first component 120*a* through the respective adhesive members 129*a*, 129*b*, and 129*c* and other adhesive members not shown in the drawings. The respective passive components 125-125*i* may be smaller than the first component 120*a*, and when the first component 120*a* is a semiconductor chip 120*a*, the respective passive components 125*a*-125*i* may be attached to an inactive surface of the semiconductor chip 120*a* so as not to be out of the inactive surface of the semiconductor chip 120*a*. The plurality of passive components 125*a*-125*i* may be electrically connected to a third connection member 160. Therefore, the plurality of passive components 125*a*-125*i* may also be electrically connected to the first component 120*a* through a first connection member 110 and a second connection member 140. A description of other configurations overlapping those described above in the fan-out semiconductor package 100A will be omitted.

Figure 19:
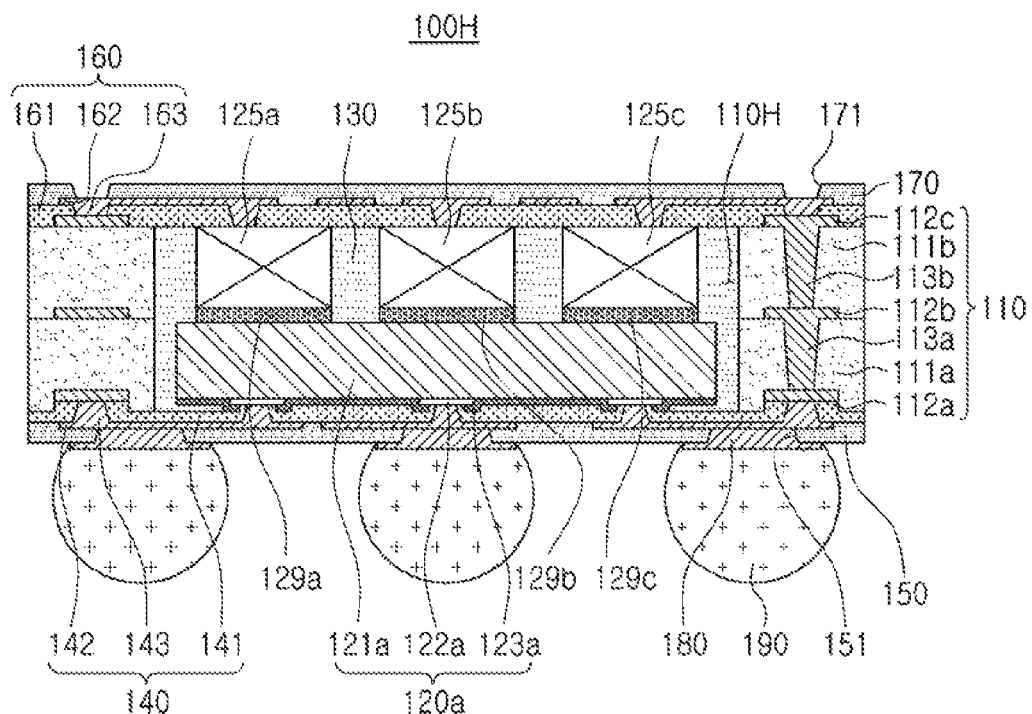
FIG. 19 is a schematic cross-sectional view illustrating a modified example of the fan-out semiconductor package of FIG. 17.

FIG. 19 is a schematic cross-sectional view illustrating a modified example of the fan-out semiconductor package of FIG. 17.

Referring to the drawing, in a fan-out semiconductor package 100H according to the modified example, a first connection member 110 may include a first insulating layer 111*a*, a first redistribution layer 112*a* embedded in the first insulating layer 111*a*, a second redistribution layer 112*b* disposed on the other surface of the first insulating layer 111*a*, opposing one surface of the first insulating layer 111*a* in which the first redistribution layer 112*a* is embedded, a second insulating layer 111*b* disposed on the first insulating layer 111*a* and covering the second redistribution layer 112*b*, and a third redistribution layer 112*c* disposed on the second insulating layer 111*b*. The first and second redistribution layers 112*a* and 112*b* and the second and third redistribution layers 112*b* and 112*c* may be electrically connected to each other through first and second vias 113*a* and 113*b* penetrating through the first and second insulating layers 111*a* and 111*b*, respectively. A description of other configurations overlapping those described above in the fan-out semiconductor packages 100A, 100B, and 100G will be omitted.

Figure 20:
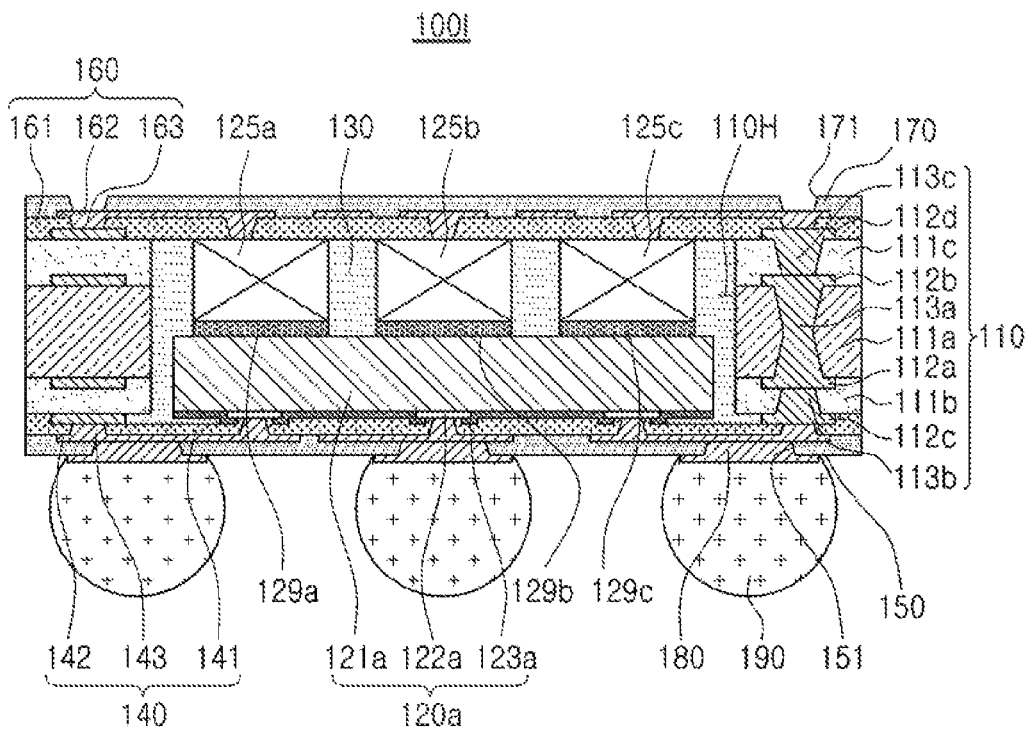
FIG. 20 is a schematic cross-sectional view illustrating another modified example of the fan-out semiconductor package of FIG. 17.

FIG. 20 is a schematic cross-sectional view illustrating another modified example of the fan-out semiconductor package of FIG. 17.

Referring to the drawing, in a fan-out semiconductor package 100I according to another modified example, a first connection member 110 may include a first insulating layer 111a, a first redistribution layer 112a and a second redistribution layer 112b disposed on opposite surfaces of the first insulating layer 111a, respectively, a second insulating layer 111b disposed on the first insulating layer 111a and covering the first redistribution layer 112a, a third redistribution layer 112c disposed on the second insulating layer 111b, a third insulating layer 111c disposed on the first insulating layer 111a and covering the second redistribution layer 112b, and a fourth redistribution layer 112d disposed on the third insulating layer 111c. The first to fourth redistribution layers 112a, 112b, 112c, and 112d may be electrically connected to each other through first to third vias 113a, 113b, and 113c penetrating through the first to third insulating layers 111a, 111b, and 111c, respectively. A description of other configurations overlapping those described above in the fan-out semiconductor packages 100A, 100C, and 100G will be omitted.

Figure 21:
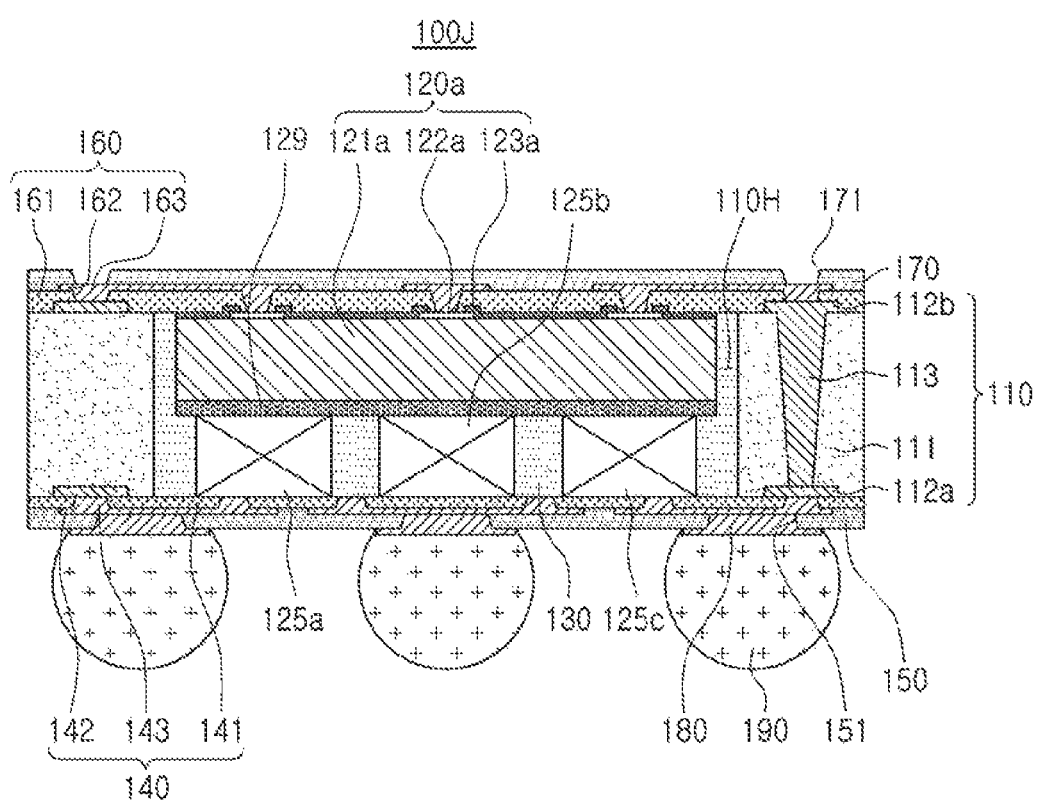
FIG. 21 is a schematic cross-sectional view illustrating another example of a fan-out semiconductor package.

FIG. 21 is a schematic cross-sectional view illustrating another example of a fan-out semiconductor package.

Figure 22:
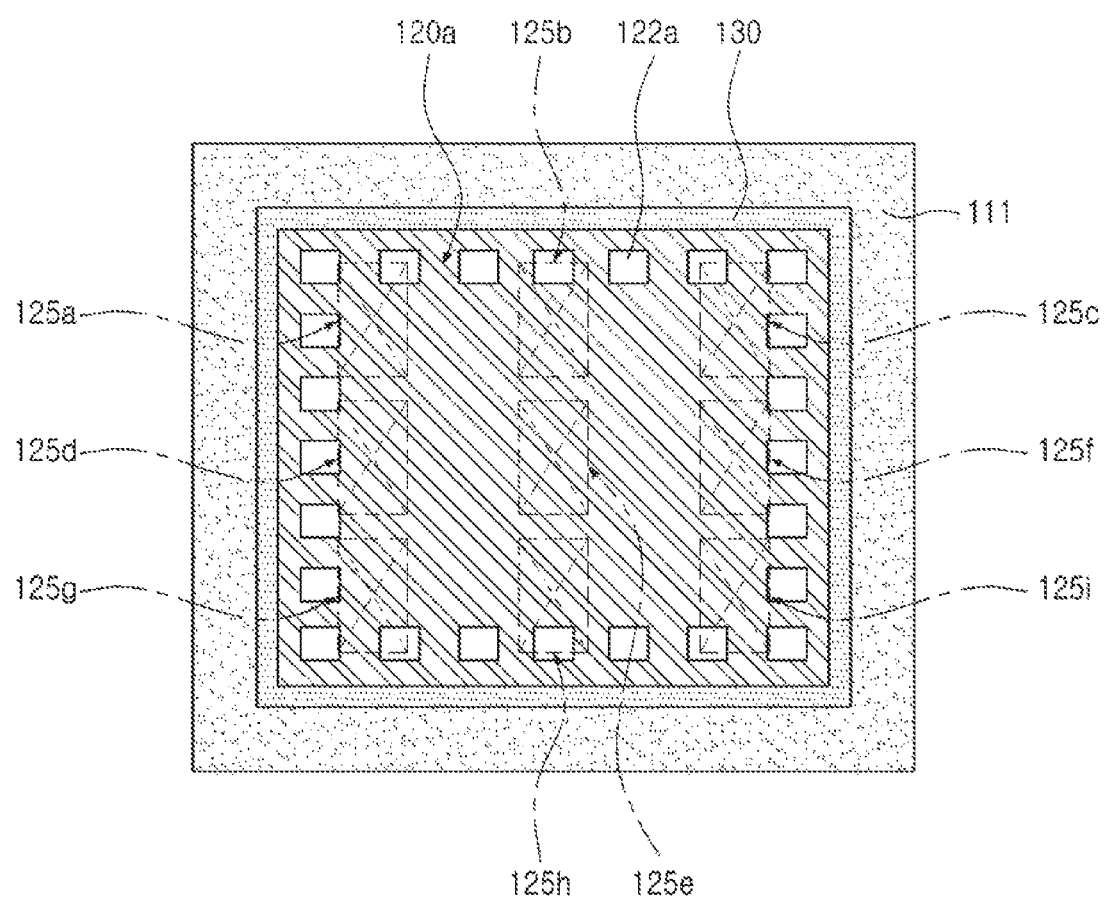
FIG. 22 is a schematic plan view of the fan-out semiconductor package of FIG. 21.

FIG. 22 is a schematic plan view of the fan-out semiconductor package of FIG. 21.

Referring to the drawing, in a fan-out semiconductor package 100J according to another exemplary embodiment in the present disclosure, positions of a first component 120a and a plurality of second components 125a, 125b, and 125c are the inverse of those of the fan-out semiconductor package 100G according to another exemplary embodiment described above. That is, a disposition sequence of the components 120a and 125a-125i may be changed. The plurality of second components 125-125i may be attached to the first component 120a through one adhesive member 129. A third connection member 160 may be disposed on the first component 120a, and a second connection member 140 may be disposed on the plurality of second components 125a-125i. The second connection member 140 and the third connection member 160 may be connected to each other through a first connection member 110. A description of other configurations overlapping those described above in the fan-out semiconductor packages 100A and 100G will be omitted.

Figure 23:
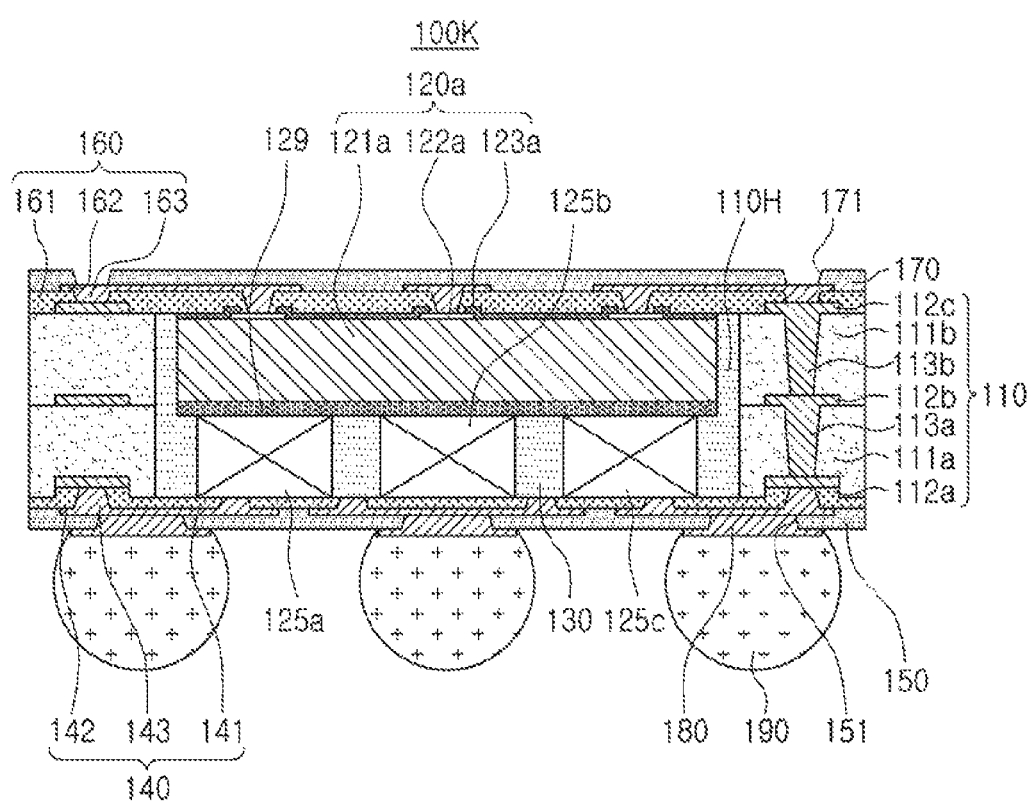
FIG. 23 is a schematic cross-sectional view illustrating a modified example of the fan-out semiconductor package of FIG. 21.

FIG. 23 is a schematic cross-sectional view illustrating a modified example of the fan-out semiconductor package of FIG. 21.

Referring to the drawing, in a fan-out semiconductor package 100K according to the modified example, a first connection member 110 may include a first insulating layer 111a, a first redistribution layer 112a embedded in the first insulating layer 111a, a second redistribution layer 112b disposed on the other surface of the first insulating layer 111a, opposing one surface of the first insulating layer 111a in which the first redistribution layer 112a is embedded, a second insulating layer 111b disposed on the first insulating layer 111a and covering the second redistribution layer 112b, and a third redistribution layer 112c disposed on the second insulating layer 111b. The first and second redistribution layers 112a and 112b and the second and third redistribution layers 112b and 112c may be electrically connected to each other through first and second vias 113a and 113b penetrating through the first and second insulating layers 111a and 111b, respectively. A description of other configurations overlapping those described above in the fan-out semiconductor packages 100A, 100B, 100G, and 100J will be omitted.

Figure 24:
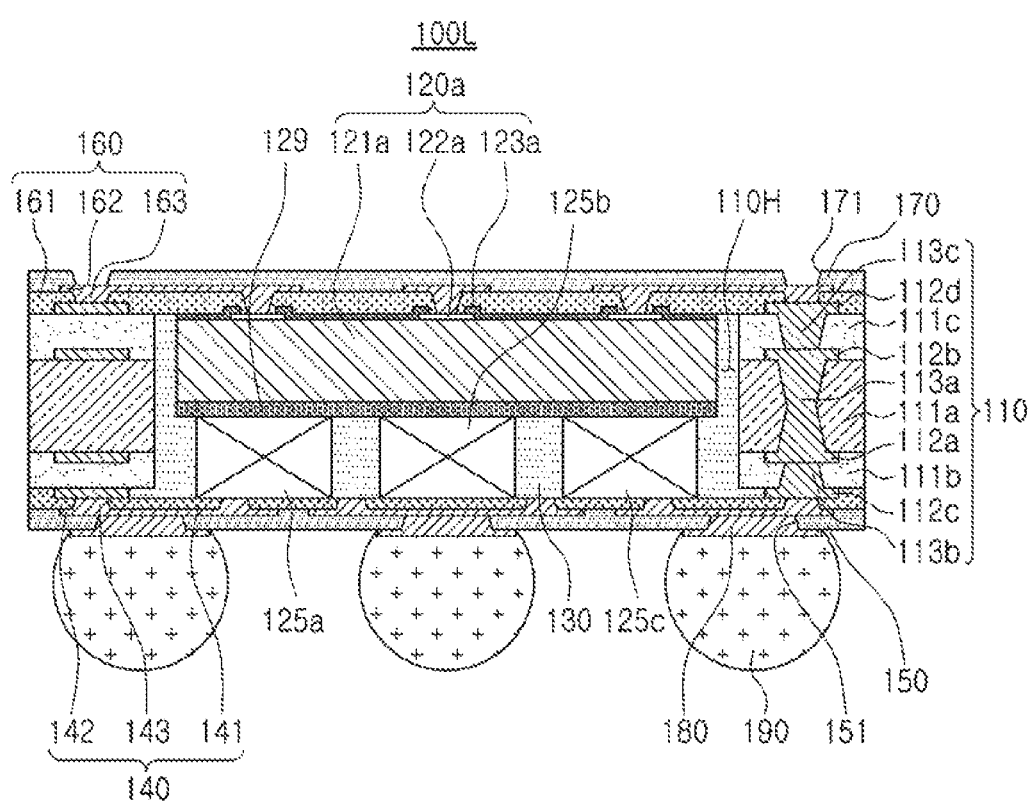
FIG. 24 is a schematic cross-sectional view illustrating another modified example of the fan-out semiconductor package of FIG. 21.

FIG. 24 is a schematic cross-sectional view illustrating another modified example of the fan-out semiconductor package of FIG. 21.

Referring to the drawing, in a fan-out semiconductor package 100L according to another modified example, a first connection member 110 may include a first insulating layer 111a, a first redistribution layer 112a and a second redistribution layer 112b disposed on opposite surfaces of the first insulating layer 111a, respectively, a second insulating layer 111b disposed on the first insulating layer 111a and covering the first redistribution layer 112a, a third redistribution layer 112c disposed on the second insulating layer 111b, a third insulating layer 111c disposed on the first insulating layer 111a and covering the second redistribution layer 112b, and a fourth redistribution layer 112d disposed on the third insulating layer 111c. The first to fourth redistribution layers 112a, 112b, 112c, and 112d may be electrically connected to each other through first to third vias 113a, 113b, and 113c penetrating through the first to third insulating layers 111a, 111b, and 111c, respectively. A description of other configurations overlapping those described above in the fan-out semiconductor packages 100A, 100C, 100G, and 100J will be omitted.

Figure 25:
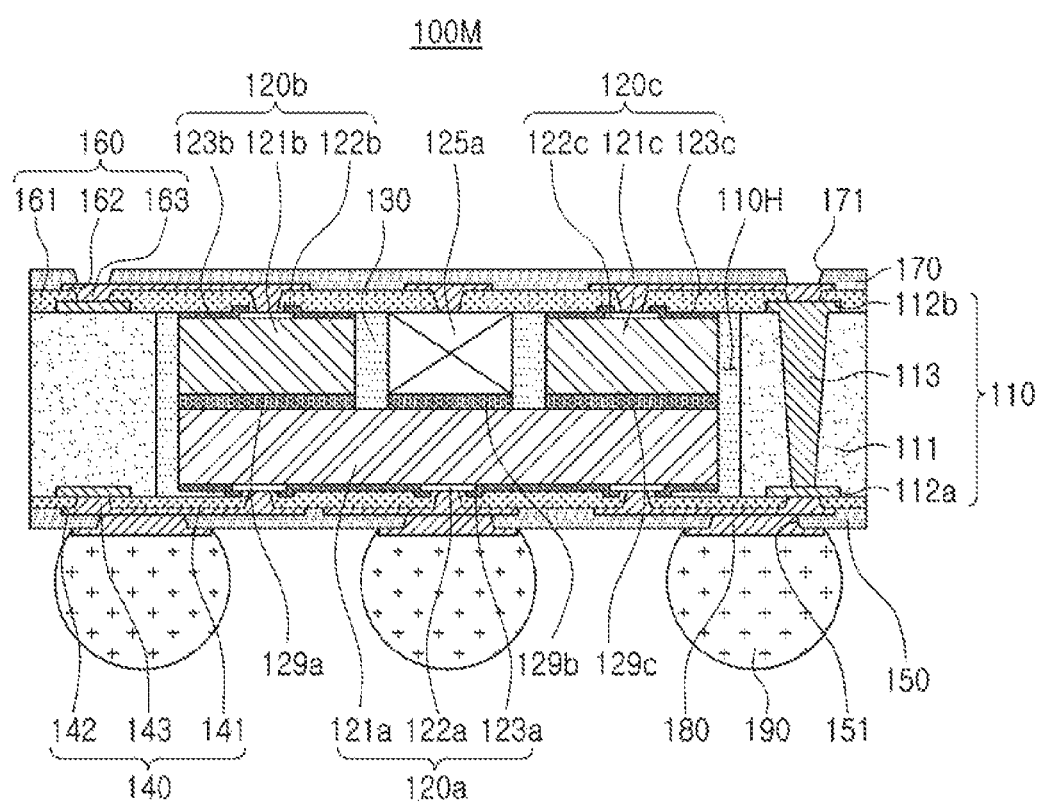
FIG. 25 is a schematic cross-sectional view illustrating another example of a fan-out semiconductor package.

FIG. 25 is a schematic cross-sectional view illustrating another example of a fan-out semiconductor package.

Figure 26:
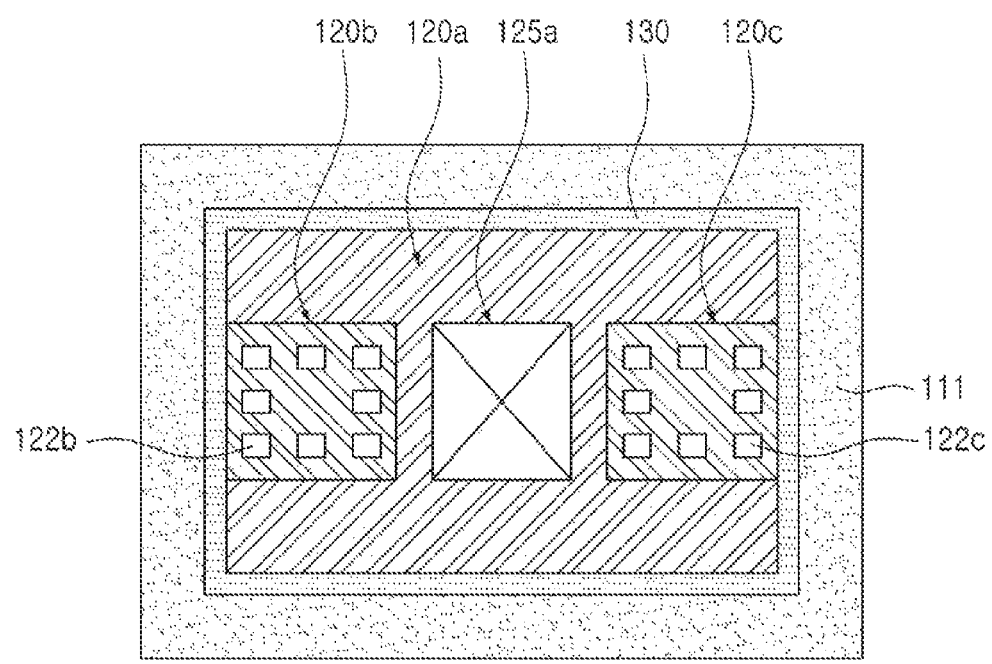
FIG. 26 is a schematic plan view of the fan-out semiconductor package of FIG. 25.

FIG. 26 is a schematic plan view of the fan-out semiconductor package of FIG. 25.

Referring to the drawings, in a fan-out semiconductor package 100M according to another exemplary embodiment in the present disclosure, a first component 120a may be a semiconductor chip 120a, and a plurality of second components 120b, 120c, and 125a may include a plurality of semiconductor chips 120b and 120c and a passive component 125a, unlike the fan-out semiconductor package 100A according to the exemplary embodiment described above. The plurality of semiconductor chips 120b and 120c may be attached to an inactive surface of the semiconductor chip 120a through adhesive members 129a and 129c, respectively, so that the respective inactive surfaces thereof face the inactive surface of the semiconductor chip 120a. The passive component 125a may be attached to the inactive surface of the semiconductor chip 120a through an adhesive member 129b. The plurality of semiconductor chips 120b and 120c and the passive component 125a may be smaller than the semiconductor chip 120a, and may be attached to the inactive surface of the semiconductor chip 120a so as to be located on the inactive surface of the semiconductor chip 120a. The semiconductor chips 120a, 120b, and 120c may be semiconductor chips that are the same as each other or may be the above-mentioned various kinds of semiconductor chips that are different from each other. The passive component 125a is also not particularly limited, but may be a known passive component such as a capacitor or an inductor. The plurality of semiconductor chips 120b and 120c and the passive component 125a may be electrically connected to a third connection member 160. Therefore, the plurality of semiconductor chips 120b and 120c and the passive component 125a may also be electrically connected to the semiconductor chip 120a through a first connection member 110 and a second connection member 140. A description of other configurations overlapping those described above in the fan-out semiconductor package 100A will be omitted.

Figure 27:
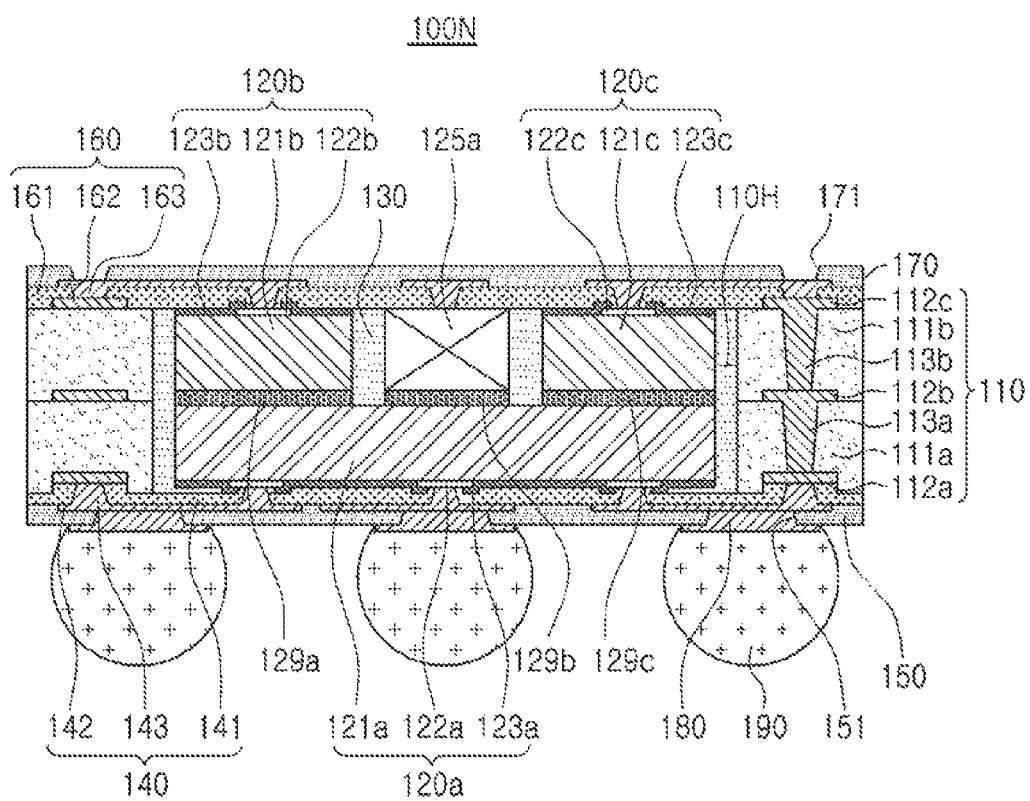
FIG. 27 is a schematic cross-sectional view illustrating a modified example of the fan-out semiconductor package of FIG. 25.

FIG. 27 is a schematic cross-sectional view illustrating a modified example of the fan-out semiconductor package of FIG. 25.

Referring to the drawing, in a fan-out semiconductor package 100N according to the modified example, a first connection member 110 may include a first insulating layer 111a, a first redistribution layer 112a embedded in the first insulating layer 111a, a second redistribution layer 112b disposed on the other surface of the first insulating layer 111a, opposing one surface of the first insulating layer 111a in which the first redistribution layer 112a is embedded, a second insulating layer 111b disposed on the first insulating layer 111a and covering the second redistribution layer 112b, and a third redistribution layer 112c disposed on the second insulating layer 111b. The first and second redistribution layers 112a and 112b and the second and third redistribution layers 112b and 112c may be electrically connected to each other through first and second vias 113a and 113b penetrating through the first and second insulating layers 111a and 111b, respectively. A description of other configurations overlapping those described above in the fan-out semiconductor packages 100A, 100B, and 100M will be omitted.

Figure 28:
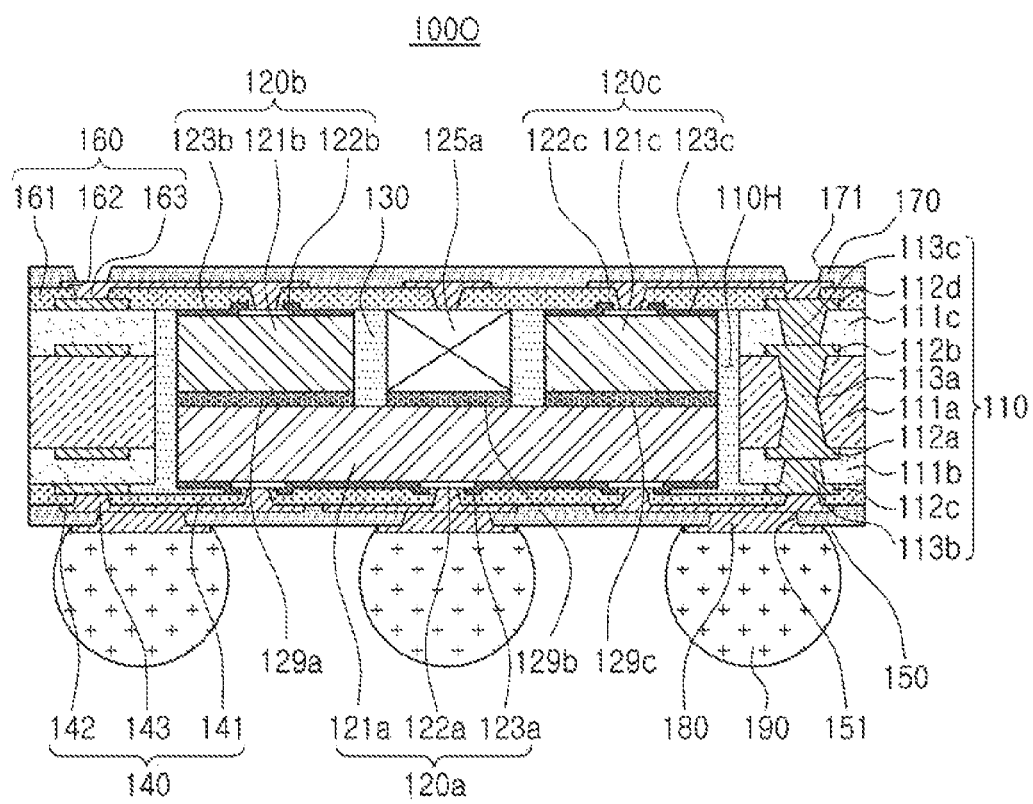
FIG. 28 is a schematic cross-sectional view illustrating another modified example of the fan-out semiconductor package of FIG. 25.

FIG. 28 is a schematic cross-sectional view illustrating another modified example of the fan-out semiconductor package of FIG. 25.

Referring to the drawing, in a fan-out semiconductor package 100O according to another modified example, a first connection member 110 may include a first insulating layer 111a, a first redistribution layer 112a and a second redistribution layer 112b disposed on opposite surfaces of the first insulating layer 111a, respectively, a second insulating layer 111b disposed on the first insulating layer 111a and covering the first redistribution layer 112a, a third redistribution layer 112c disposed on the second insulating layer 111b, a third insulating layer 111c disposed on the first insulating layer 111a and covering the second redistribution layer 112b, and a fourth redistribution layer 112d disposed on the third insulating layer 111c. The first to fourth redistribution layers 112a, 112b, 112c, and 112d may be electrically connected to each other through first to third vias 113a, 113b, and 113c penetrating through the first to third insulating layers 111a, 111b, and 111c, respectively. A description of other configurations overlapping those described above in the fan-out semiconductor packages 100A, 100C, and 100M will be omitted.

Figure 29:
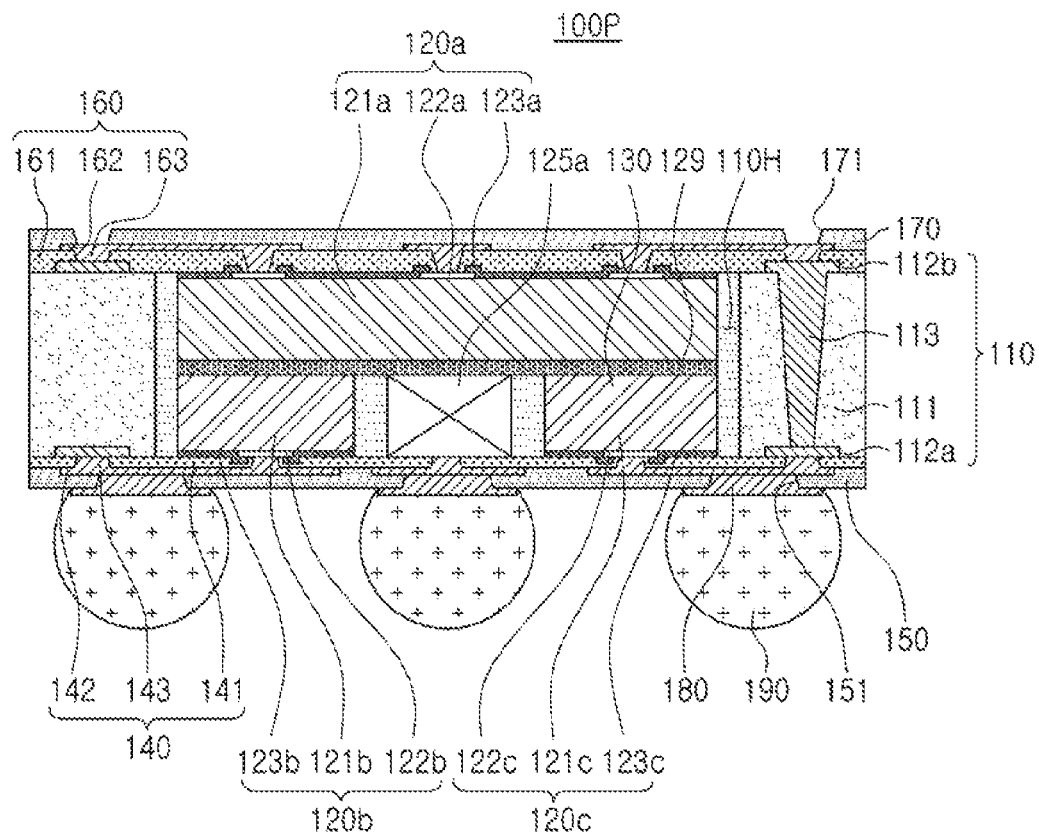
FIG. 29 is a schematic cross-sectional view illustrating another example of a fan-out semiconductor package.

FIG. 29 is a schematic cross-sectional view illustrating another example of a fan-out semiconductor package.

Figure 30:
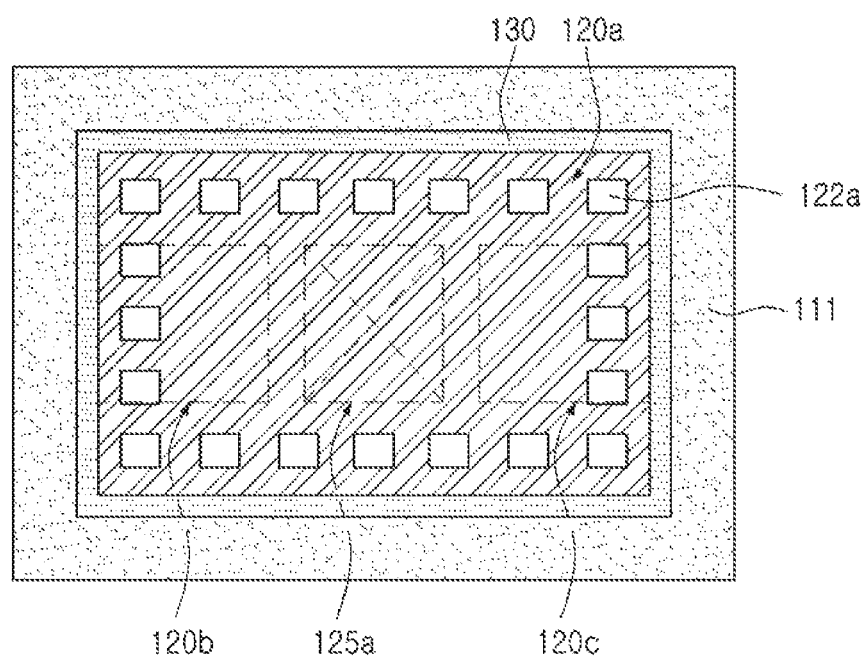
FIG. 30 is a schematic plan view of the fan-out semiconductor package of FIG. 29.

FIG. 30 is a schematic plan view of the fan-out semiconductor package of FIG. 29.

Referring to the drawing, in a fan-out semiconductor package 100P according to another exemplary embodiment in the present disclosure, positions of a first component 120a and a plurality of second components 120a, 120b, and 125a are the inverse of those of the fan-out semiconductor package 100M according to another exemplary embodiment described above. That is, a disposition sequence of the components 120a, 120b, 120c, and 125a may be changed. The plurality of second components 120b, 120c, and 125a may be attached to the first component 120a through one adhesive member 129. A third connection member 160 may be disposed on the first component 120a, and a second connection member 140 may be disposed on the plurality of second components 120b, 120c, and 125a. The second connection member 140 and the third connection member 160 may be connected to each other through a first connection member 110. A description of other configurations overlapping those described above in the fan-out semiconductor packages 100A, 100G, and 100M will be omitted.

Figure 31:
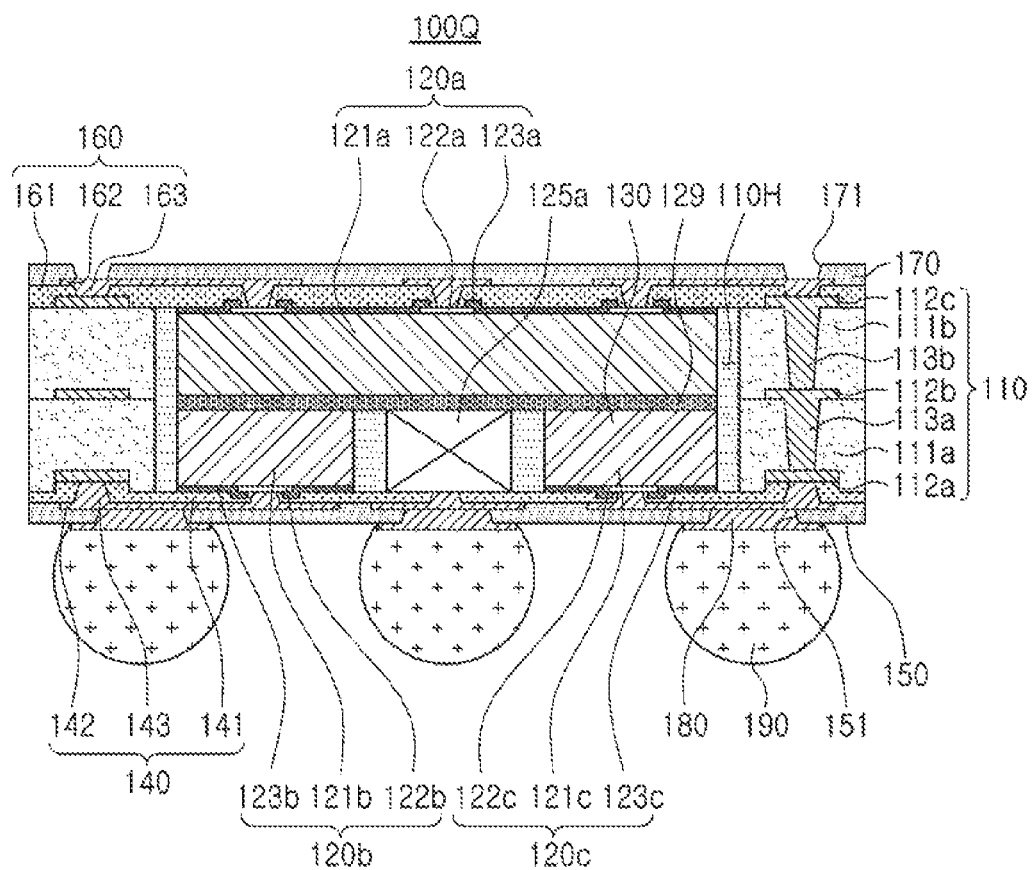
FIG. 31 is a schematic cross-sectional view illustrating a modified example of the fan-out semiconductor package of FIG. 29.

FIG. 31 is a schematic cross-sectional view illustrating a modified example of the fan-out semiconductor package of FIG. 29.

Referring to the drawing, in a fan-out semiconductor package 100Q according to the modified example, a first connection member 110 may include a first insulating layer 111a, a first redistribution layer 112a embedded in the first insulating layer 111a, a second redistribution layer 112b disposed on the other surface of the first insulating layer 111a, opposing one surface of the first insulating layer 111a in which the first redistribution layer 112a is embedded, a second insulating layer 111b disposed on the first insulating layer 111a and covering the second redistribution layer 112b, and a third redistribution layer 112c disposed on the second insulating layer 111b. The first and second redistribution layers 112a and 112b and the second and third redistribution layers 112b and 112c may be electrically connected to each other through first and second vias 113a and 113b penetrating through the first and second insulating layers 111a and 111b, respectively. A description of other configurations overlapping those described above in the fan-out semiconductor packages 100A, 100B, 100M, and 100P will be omitted.

Figure 32:
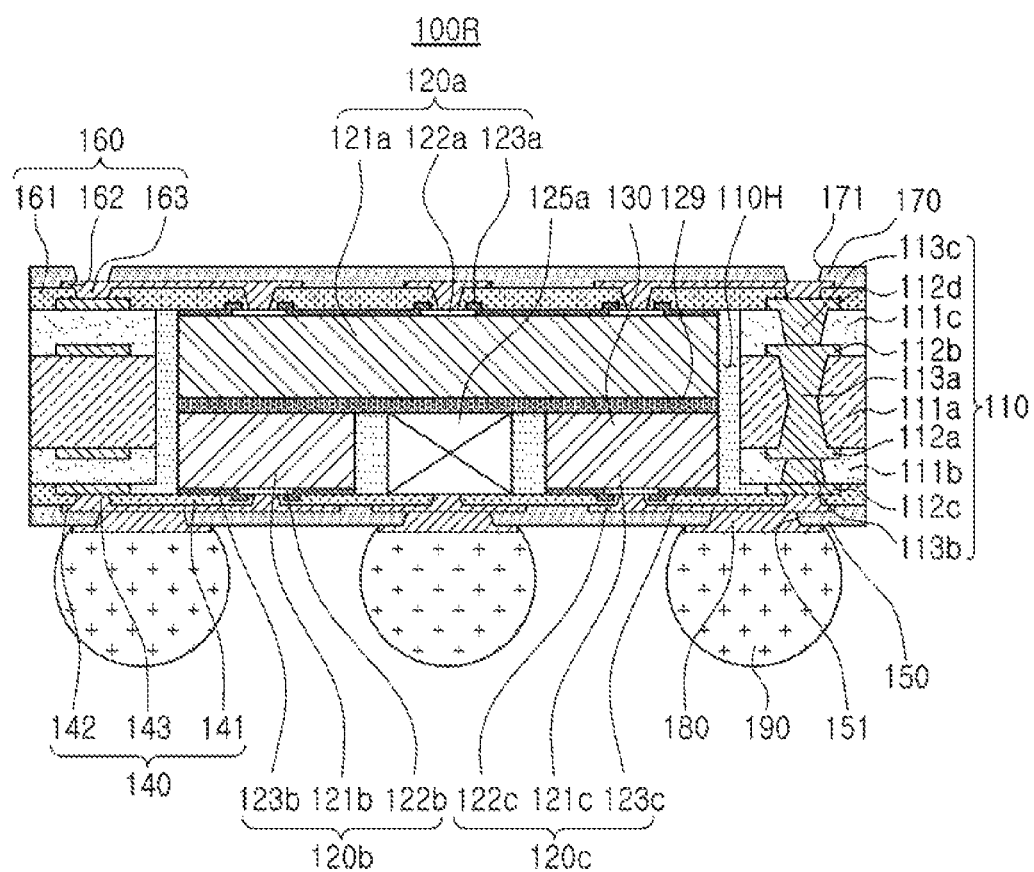
FIG. 32 is a schematic cross-sectional view illustrating another modified example of the fan-out semiconductor package of FIG. 29.

FIG. 32 is a schematic cross-sectional view illustrating another modified example of the fan-out semiconductor package of FIG. 29.

Referring to the drawing, in a fan-out semiconductor package 100R according to another modified example, a first connection member 110 may include a first insulating layer 111a, a first redistribution layer 112a and a second redistribution layer 112b disposed on opposite surfaces of the first insulating layer 111a, respectively, a second insulating layer 111b disposed on the first insulating layer 111a and covering the first redistribution layer 112a, a third redistribution layer 112c disposed on the second insulating layer 111b, a third insulating layer 111c disposed on the first insulating layer 111a and covering the second redistribution layer 112b, and a fourth redistribution layer 112d disposed on the third insulating layer 111c. The first to fourth redistribution layers 112a, 112b, 112c, and 112d may be electrically connected to each other through first to third vias 113a, 113b, and 113c penetrating through the first to third insulating layers 111a, 111b, and 111c, respectively. A description of other configurations overlapping those described above in the fan-out semiconductor packages 100A, 100C, 100M, and 100P will be omitted.

Figure 33:
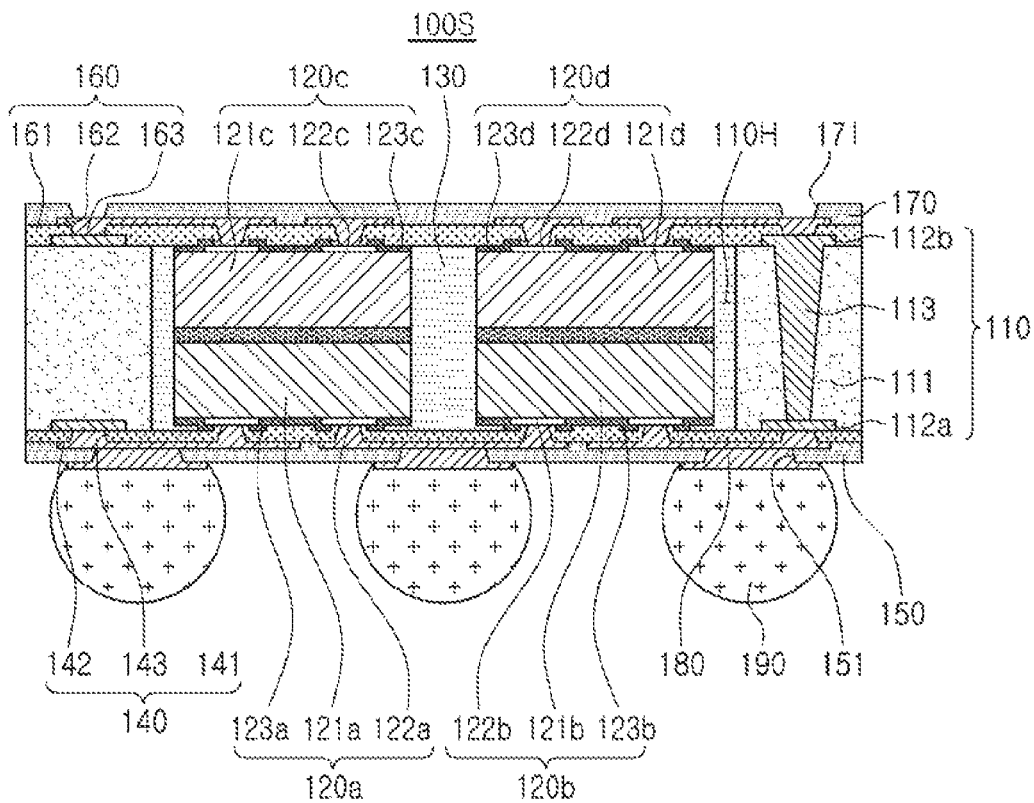
FIG. 33 is a schematic cross-sectional view illustrating another example of a fan-out semiconductor package.

FIG. 33 is a schematic cross-sectional view illustrating another example of a fan-out semiconductor package.

Figure 34:
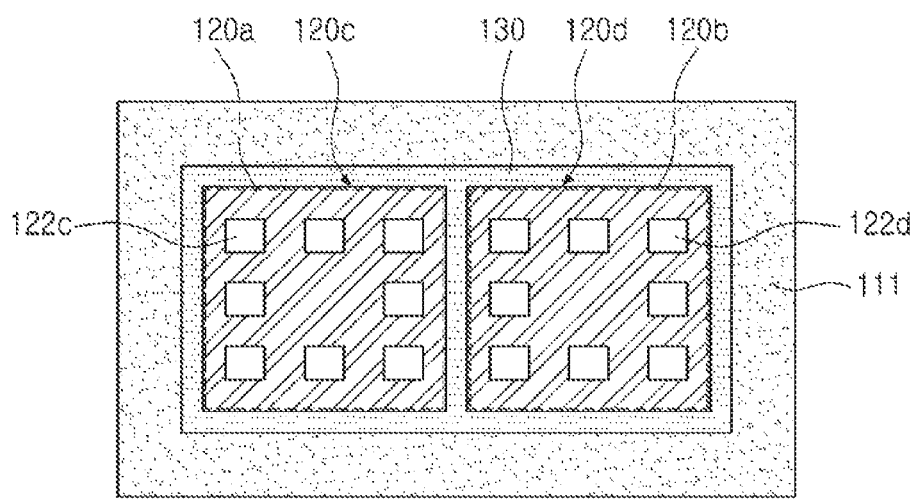
FIG. 34 is a schematic plan view of the fan-out semiconductor package of FIG. 33.

FIG. 34 is a schematic plan view of the fan-out semiconductor package of FIG. 33.

Referring to the drawings, in a fan-out semiconductor package 100S according to another exemplary embodiment in the present disclosure, a plurality of second components 120c and 120d may be attached to a plurality of first components 120a and 120b, respectively. For example, the plurality of first components 120a and 120b may include first and second semiconductor chips 120a and 120b, each having active surfaces having connection pads 122a and 122b disposed thereon and inactive surfaces opposing the active surfaces, the plurality of second components 120c and 120d may include third and fourth semiconductor chips 120c and 120d, each having active surfaces having connection pads 122c and 122d disposed thereon and inactive surfaces opposing the active surfaces, and the third and fourth semiconductor chips 120c and 120d may be attached to the inactive surfaces of the first and second semiconductor chips 120a and 120b through adhesive members 129a and 129b, respectively, so that the inactive surfaces thereof face the inactive surfaces of the first and second semiconductor chips 120a and 120b, respectively. As a non-restrictive example, the first to fourth semiconductor chips 120a, 120b, 120c, and 120d may be the same or different memories, more specifically, DRAMs, but are not limited thereto. The fourth semiconductor chip 120d may include a body 121d, connection pads 122d, and a passivation layer 123d. A description of other configurations overlapping those described above in the fan-out semiconductor package 100A will be omitted.

Figure 35:
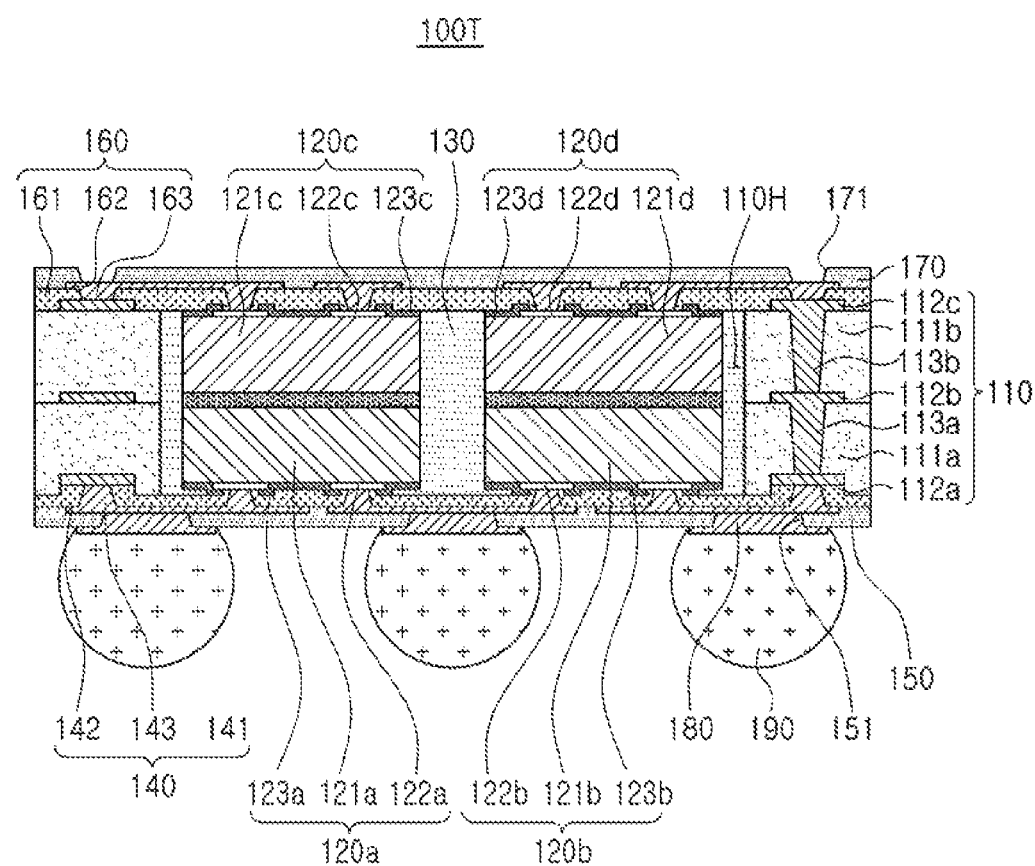
FIG. 35 is a schematic cross-sectional view illustrating a modified example of the fan-out semiconductor package of FIG. 33.

FIG. 35 is a schematic cross-sectional view illustrating a modified example of the fan-out semiconductor package of FIG. 33.

Referring to the drawing, in a fan-out semiconductor package 100T according to the modified example, a first connection member 110 may include a first insulating layer 111a, a first redistribution layer 112a embedded in the first insulating layer 111a, a second redistribution layer 112b disposed on the other surface of the first insulating layer 111a, opposing one surface of the first insulating layer 111a in which the first redistribution layer 112a is embedded, a second insulating layer 111b disposed on the first insulating layer 111a and covering the second redistribution layer 112b, and a third redistribution layer 112c disposed on the second insulating layer 111b. The first and second redistribution layers 112a and 112b and the second and third redistribution layers 112b and 112c may be electrically connected to each other through first and second vias 113a and 113b penetrating through the first and second insulating layers 111a and 111b, respectively. A description of other configurations overlapping those described above in the fan-out semiconductor packages 100A, 100B, and 100S will be omitted.

Figure 36:
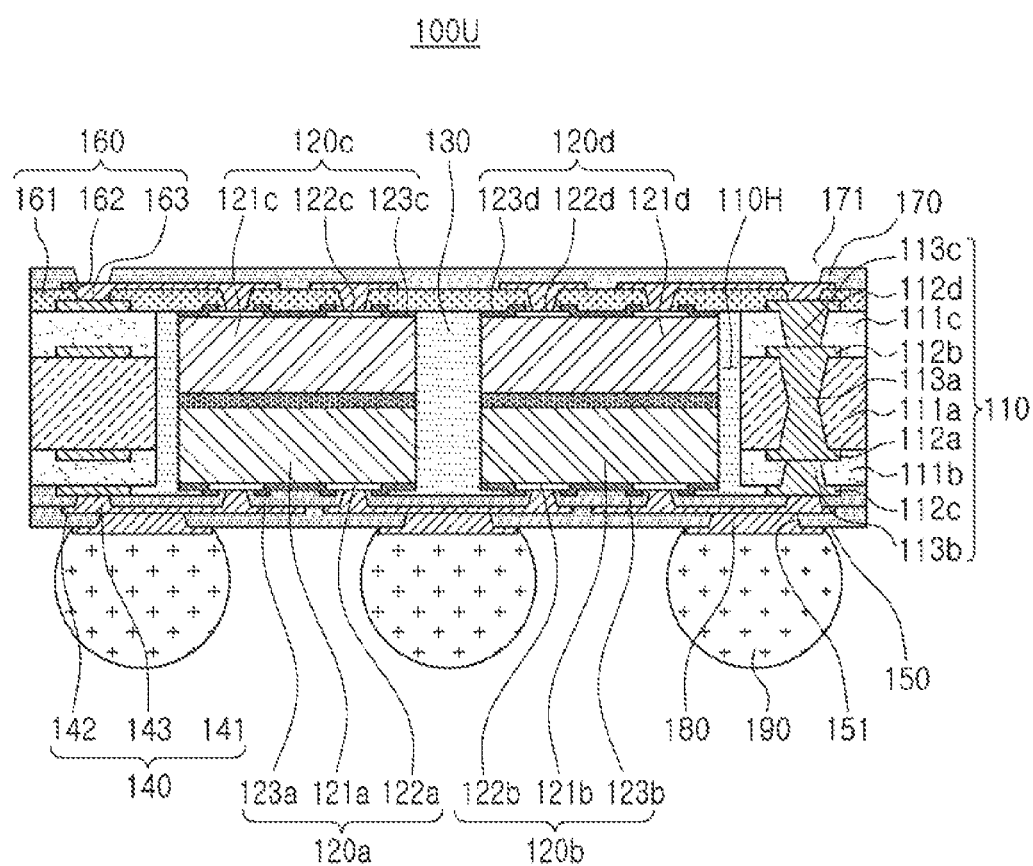
FIG. 36 is a schematic cross-sectional view illustrating another modified example of the fan-out semiconductor package of FIG. 33.

FIG. 36 is a schematic cross-sectional view illustrating another modified example of the fan-out semiconductor package of FIG. 33.

Referring to the drawing, in a fan-out semiconductor package 100U according to another modified example, a first connection member 110 may include a first insulating layer 111a, a first redistribution layer 112a and a second redistribution layer 112b disposed on opposite surfaces of the first insulating layer 111a, respectively, a second insulating layer 111b disposed on the first insulating layer 111a and covering the first redistribution layer 112a, a third redistribution layer 112c disposed on the second insulating layer 111b, a third insulating layer 111c disposed on the first insulating layer 111a and covering the second redistribution layer 112b, and a fourth redistribution layer 112d disposed on the third insulating layer 111c. The first to fourth redistribution layers 112a, 112b, 112c, and 112d may be electrically connected to each other through first to third vias 113a, 113b, and 113c penetrating through the first to third insulating layers 111a, 111b, and 111c, respectively. A description of other configurations overlapping those described above in the fan-out semiconductor packages 100A, 100C, and 100S will be omitted.

As set forth above, according to the exemplary embodiments in the present disclosure, a fan-out semiconductor package capable of simultaneously performing various functions and being miniaturized and thinned may be provided.

While exemplary embodiments have been shown and described above, it will be apparent to those skilled in the art that modifications and variations could be made without departing from the scope of the present invention as defined by the appended claims.

What is claimed is:

1. A fan-out semiconductor package comprising:
a first connection member having a through-hole;
a first component disposed in the through-hole;
a second component disposed in the through-hole and attached to the first component;
an encapsulant filling at least portions of spaces between walls of the through-hole and side surfaces of the first component and side surfaces of the second component;
a second connection member disposed on the first connection member and the first component and including a redistribution layer electrically connected to the first component; and
a third connection member disposed on the first connection member and the second component and including a redistribution layer electrically connected to the second component,
wherein a number of at least one of first or second components is plural,
the second and third connection members are connected to each other through the first connection member, and
the first connection member includes a redistribution layer electrically connected to the redistribution layer of the second connection member and the redistribution layer of the third connection member.

2. The fan-out semiconductor package of claim 1, wherein a plurality of second components are attached to the first component.

3. The fan-out semiconductor package of claim 2, wherein the first component is a first semiconductor chip having an active surface, having connection pads disposed thereon, and an inactive surface opposing the active surface, and
the plurality of second components are attached to the inactive surface of the first semiconductor chip.

4. The fan-out semiconductor package of claim 3, wherein the plurality of second components are located on the inactive surface of the first semiconductor chip.

5. The fan-out semiconductor package of claim 3, wherein the plurality of second components include second and third semiconductor chips, each having an active surface having connection pads disposed thereon and an inactive surface opposing the active surface, and
the second and third semiconductor chips are attached to the inactive surface of the first semiconductor chip so that the inactive surfaces thereof face the inactive surface of the first semiconductor chip.

6. The fan-out semiconductor package of claim 5, wherein the plurality of second components further include a passive component.

7. The fan-out semiconductor package of claim 3, wherein the plurality of second components are a plurality of passive components.

8. The fan-out semiconductor package of claim 1, wherein a plurality of second components are attached to a plurality of first components, respectively.

9. The fan-out semiconductor package of claim 8, wherein the plurality of first components include first and second semiconductor chips, each having active surface having connection pads disposed thereon and an inactive surface opposing the active surface,
the plurality of second components include third and fourth semiconductor chips, each having an active surface having connection pads disposed thereon and an inactive surface opposing the active surface, and the third and fourth semiconductor chips are attached to the inactive surfaces of the first and second semiconductor chips, respectively, so that the inactive surfaces thereof face the inactive surfaces of the first and second semiconductor chips, respectively.

10. The fan-out semiconductor package of claim 1, further comprising:
a first passivation layer disposed on the second connection member;
a second passivation layer disposed on the third connection member;
an underbump metal layer disposed in openings formed in the first passivation layer or openings formed in the second passivation layer; and
connection terminals disposed on the underbump metal layer,
wherein at least one of the connection terminals is disposed in a fan-out region that is a region does not overlap, in a direction along which the second component is attached to the first component, with one of the first and second components having a largest area.

11. The fan-out semiconductor package of claim 1, wherein the first connection member includes a first insulating layer, a first redistribution layer embedded in the first insulating layer, and a second redistribution layer disposed on the other surface of the first insulating layer, opposing one surface of the first insulating layer in which the first redistribution layer is embedded, and
the first and second redistribution layers are electrically connected to the first and second components.

12. The fan-out semiconductor package of claim 11, wherein the first connection member further includes a second insulating layer disposed on the first insulating layer and covering the second redistribution layer and a third redistribution layer disposed on the second insulating layer, and
the third redistribution layer is electrically connected to the first and second components.

13. The fan-out semiconductor package of claim 12, wherein the second redistribution layer is disposed on a level between the second and third connection members, and
the second redistribution layer is not in contact with the second and third connection members.

14. The fan-out semiconductor package of claim 1, wherein the first connection member includes a first insulating layer, a first redistribution layer and a second redistribution layer disposed on opposite surfaces of the first insulating layer, respectively, a second insulating layer disposed on the first insulating layer and covering the first redistribution layer, and a third redistribution layer disposed on the second insulating layer, and the first to third redistribution layers are electrically connected to the first and second components.

15. The fan-out semiconductor package of claim 14, wherein the first connection member further includes a third insulating layer disposed on the first insulating layer and covering the second redistribution layer and a fourth redistribution layer disposed on the third insulating layer, and
the fourth redistribution layer is electrically connected to the first and second components.

16. The fan-out semiconductor package of claim 14, wherein the second redistribution layer is disposed on a level between the second and third connection members, and
the second redistribution layer is not in contact with the second and third connection members.

17. A fan-out semiconductor package comprising:
a first connection member having a through-hole and including a first redistribution layer;
a first electronic component and a second electronic components stacked on each other in the through-hole of the first connection member, each of the first and second electronic components having electric contacts;
a second connection member including a second redistribution layer; and
a third connection member including a third redistribution layer,
wherein the first connection member, the first electronic component, and the second electronic component are disposed between the second connection member and the third connection member,
the electric contacts of the first electronic component face the second connection member and are electrically connected to the second redistribution layer of the second connection member,
the electric contacts of the second electronic component face the third connection member and are electrically connected to the third redistribution layer of the third connection member, and
the second and third redistribution layers are electrically connected to each other at least through the first redistribution layer.

18. The fan-out semiconductor package of claim 17, further comprising an adhesive member bonding the first electronic component and the second electronic component to each other.

19. The fan-out semiconductor package of claim 17, further comprising connection terminals disposed on the second connection member, and not overlapping, in a direction along which the first and second electronic components are stacked, with one of the first and second electronic components having a larger area.

20. The fan-out semiconductor package of claim 17, further comprising an encapsulant encapsulating portions of the first and second electronic components.

* * * * *